United States Patent
Arai et al.

(10) Patent No.: US 10,820,414 B2
(45) Date of Patent: Oct. 27, 2020

(54) SURFACE TREATED COPPER FOIL, COPPER FOIL WITH CARRIER, LAMINATE, METHOD FOR MANUFACTURING PRINTED WIRING BOARD, AND METHOD FOR MANUFACTURING ELECTRONIC DEVICE

(71) Applicant: JX Nippon Mining & Metals Corporation, Tokyo (JP)

(72) Inventors: Hideta Arai, Ibaraki (JP); Ryo Fukuchi, Ibaraki (JP); Atsushi Miki, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 119 days.

(21) Appl. No.: 15/827,056

(22) Filed: Nov. 30, 2017

(65) Prior Publication Data

US 2018/0160529 A1 Jun. 7, 2018

(30) Foreign Application Priority Data

Dec. 5, 2016 (JP) .................................. 2016-236250
Oct. 24, 2017 (JP) .................................. 2017-205410

(51) Int. Cl.
*B21C 37/00* (2006.01)
*H05K 1/09* (2006.01)
(Continued)

(52) U.S. Cl.
CPC .............. *H05K 1/09* (2013.01); *H05K 3/007* (2013.01); *H05K 3/06* (2013.01); *H05K 3/384* (2013.01);
(Continued)

(58) Field of Classification Search
None
See application file for complete search history.

(56) References Cited

U.S. PATENT DOCUMENTS 4,902,551 A 2/1990 Nakaso et al.
5,366,814 A * 11/1994 Yamanishi ............. H05K 3/384
                                                    205/111
(Continued)

FOREIGN PATENT DOCUMENTS

CN        1386044 A    12/2002
EP        1441046 B1    5/2008
(Continued)

OTHER PUBLICATIONS

Office Action in KR Application No. 10-2017-0165727 dated May 3, 2019, 19 pages.
(Continued)

*Primary Examiner* — Seth Dumbris
(74) *Attorney, Agent, or Firm* — Marshall, Gerstein & Borun LLP

(57) ABSTRACT

Disclosed is a surface treated copper foil, which is capable of favorably reducing the transmission loss even when used in a high frequency circuit substrate, and after laminating with a resin, heating at a predetermined temperature for a predetermined time (at 180° C. for 10 days), the peel strength of the surface treated copper foil and the resin is favorable.

Also disclosed is a surface treated copper foil, comprising a copper foil, and a surface treatment layer on one or both sides of the copper foil, wherein the surface treatment layer has a primary particle layer, or has a primary particle layer and s secondary particle layer in this order from the side of the copper foil; the surface treatment layer contains Zn, a deposition amount of Zn in the surface treatment layer is 150 μg/dm² or more; the surface treatment layer does not contain Ni, or in the case where the surface treatment layer contains Ni, a deposition amount of Ni in the surface treatment layer is 800 μg/dm² or less; the surface treatment layer does not contain Co, or in the case where the surface treatment layer (Continued)

contains Co, a deposition amount of Co in the surface treatment layer is 3000 µg/dm² or less; and a ten point average roughness Rz of an outermost surface of the surface treatment layer is 1.5 µm or less.

24 Claims, 4 Drawing Sheets

(51) Int. Cl.
*H05K 3/06* (2006.01)
*H05K 3/00* (2006.01)
*H05K 3/38* (2006.01)
*H05K 3/40* (2006.01)
*H05K 3/42* (2006.01)

(52) U.S. Cl.
CPC ......... *H05K 3/0035* (2013.01); *H05K 3/4007* (2013.01); *H05K 3/421* (2013.01); *H05K 2201/0355* (2013.01); *Y10T 428/12431* (2015.01)

(56) References Cited

U.S. PATENT DOCUMENTS

| | | | |
|---|---|---|---|
| 2002/0053517 A1* | 5/2002 | Endo | C25D 5/10 205/182 |
| 2002/0182433 A1* | 12/2002 | Endo | C25D 3/58 428/606 |
| 2004/0154930 A1 | 8/2004 | Shinozaki | |
| 2013/0011690 A1* | 1/2013 | Arai | C25D 5/12 428/548 |
| 2015/0047884 A1* | 2/2015 | Nagaura | H05K 3/388 174/255 |
| 2016/0183380 A1 | 6/2016 | Ishii et al. | |
| 2016/0374205 A1 | 12/2016 | Moriyama et al. | |

FOREIGN PATENT DOCUMENTS

| | | |
|---|---|---|
| EP | 2644753 B1 | 5/2016 |
| JP | 2004-244656 A | 9/2004 |
| JP | 4161304 B2 | 10/2008 |
| JP | 4704025 B2 | 6/2011 |
| JP | 2015-105440 A | 6/2015 |
| JP | 6023367 B1 | 11/2016 |
| TW | 201545611 A | 12/2015 |

OTHER PUBLICATIONS

Office Action in Philippine Application No. 1/2017/000346 dated May 15, 2018, 10 pages.

Office Action in TW Application No. 10721002060 dated Oct. 26, 2018, 13 pages.

\* cited by examiner

Laminating resin and copper foil with carrier

Releasing carrier foil from second layer

Laser drilling

Via fill

Second circuit plating

Releasing carrier foil from first layer

J

Flash etching

K

Forming bump and copper pillar

SURFACE TREATED COPPER FOIL, COPPER FOIL WITH CARRIER, LAMINATE, METHOD FOR MANUFACTURING PRINTED WIRING BOARD, AND METHOD FOR MANUFACTURING ELECTRONIC DEVICE

TECHNICAL FIELD

The present invention is related to a surface-treated copper foil, a copper foil with carrier, a laminate, a method for manufacturing a printed wiring board and a method for manufacturing an electronic device.

BACKGROUND ART

Printed wiring boards have made significant progress over the last half century and have been used to almost all electronic devices nowadays. Along with the recent trend toward miniaturization and high performance of electronic equipment, high density mounting of mounted parts and high frequency signal have progressed, and excellent high frequency response is required for printed wiring boards.

As to substrates for high frequency, in order to ensure the quality of the output signal, reduction of transmission loss is required. The transmission loss mainly consists of dielectric loss caused by resin (the substrate side) and conductor loss caused by conductor (the copper foil side). The dielectric loss decreases as the dielectric constant and dielectric loss tangent of the resin become smaller. In the high frequency signal, the conductor loss is mainly caused by the fact that the cross-sectional area through which the current flows decreases and the resistance increases due to the skin effect that current flows only on the surface of the conductor as the frequency becomes higher.

As a technique aimed at reducing the transmission loss of a copper foil for high frequency circuit, for example, Patent Document 1 discloses a metal foil for high frequency circuit, in which one surface or both surfaces of the metal foil surface are coated with silver or silver alloy metal, the layer of the silver or the silver alloy coated with a layer which is other than silver or silver alloy, and is thinner than the layer of the silver or the silver alloy. According to this disclosure, it is described that it is possible to provide a metal foil with a reduced loss due to the skin effect even in a super-high frequency region used in satellite communication.

In addition, Patent Document 2 discloses a roughing treated rolled copper foil for high frequency circuit as a raw material for a printed circuit board, wherein an integrated intensity (I (200)) of the (200) plane obtained by X-ray diffraction on the rolled surface of a rolled copper foil after recrystallization annealing, and an integrated intensity (I0 (200)) of the (200) plane obtained by X-ray diffraction on a fine copper powder, satisfy the formula (200)/I 0 (200)>40, and after a roughening treatment on the rolling surface by electrolytic plating, an arithmetic average roughness (Hereinafter referred to as Ra) of the roughening treated face is from 0.02 μm to 0.2 μm, a ten point average roughness (hereinafter referred to as Rz) of the roughening treated face is 0.1 μm to 1.5 μm. According to this disclosure, it is described that a printed circuit board which can be used under a high frequency exceeding 1 GHz, can be provided.

Further, Patent Document 3 discloses an electrolytic copper foil characterized in that a part of the surface of the copper foil is covered with a rugged surface consisting of bump shaped protrusions and having a surface roughness of 2 μm to 4 μm. According to this disclosure, it is described that an electrolytic copper foil having excellent high frequency transmission characteristics can be provided.

CITATION LIST

Patent Literature

[PTL 1] Japanese Patent No. 4161304
[PTL 2] Japanese Patent No. 4704025
[PTL 3] Japanese Patent Publication No. 2004-244656

SUMMARY

Technical Problem

Various studies have been made on the control of the transmission loss of the copper foil when used for a high frequency circuit substrate as described above, but there is still much room for development to be done. Further it is necessary to ensure that, after laminating the surface treated copper foil, from the side of the surface treatment layer, with a resin, heating at a predetermined temperature for a predetermined time (at 180° C. for 10 days), the peel strength of the surface treated copper foil and the resin is favorable.

Solution to Problem

The inventors have discovered that, by controlling the deposition amount of predetermined metal(s) in the surface treatment layer, which is obtained by forming a primary particle layer or by forming a primary particle layer and a secondary particle layer on a copper foil, and controlling the ten point average roughness Rz of the outermost surface of the surface treatment layer, it is possible to favorably reduce the transmission loss even when used in a high frequency circuit substrate, and have found that, after laminating the surface treated copper foil with a resin, heating at a predetermined temperature for a predetermined time (at 180° C. for 10 days), the peel strength of the surface treated copper foil and the resin is favorable.

One or more embodiments of the present invention has been completed on the basis of the above findings, and in one aspect, the present disclosure is a surface treated copper foil, comprising a copper foil, and a surface treatment layer on one or both sides of the copper foil, wherein the surface treatment layer has a primary particle layer, or has a primary particle layer and s secondary particle layer in this order from the side of the copper foil; the surface treatment layer contains Zn, a deposition amount of Zn in the surface treatment layer is 150 μg/dm$^2$ or more; the surface treatment layer does not contain Ni, or in the case where the surface treatment layer contains Ni, a deposition amount of Ni in the surface treatment layer is 800 μg/dm$^2$ or less; the surface treatment layer does not contain Co, or in the case where the surface treatment layer contains Co, a deposition amount of Co in the surface treatment layer is 3000 μg/dm$^2$ or less; and a ten point average roughness Rz of an outermost surface of the surface treatment layer is 1.5 μm or less.

According to another aspect, the present disclosure is a surface treated copper foil, comprising a copper foil, and a surface treatment layer on one or both sides of the copper foil, wherein the surface treatment layer has a primary particle layer, or has a primary particle layer and s secondary particle layer in this order from the side of the copper foil; the surface treatment layer contains Zn and Mo, a sum of deposition amount of Zn and Mo in the surface treatment layer is 200 μg/dm$^2$ or more; the surface treatment layer does not contain Ni, or in the case where the surface treatment layer contains Ni, a deposition amount of Ni in the surface treatment layer is 800 μg/dm² or less; the surface treatment layer does not contain Co, or in the case where the surface treatment layer contains Co, a deposition amount of Co in the surface treatment layer is 3000 μg/dm² or less; and a ten point average roughness Rz of an outermost surface of the surface treatment layer is 1.5 μm or less.

According to another embodiment of the surface treated copper foil of the present disclosure, the surface treatment layer contains Co.

According to yet another embodiment of the surface treated copper foil of the present disclosure, the surface treatment layer contains Ni.

According to yet another embodiment of the surface treated copper foil of the present disclosure, the surface treatment layer contains Co and Ni, and a sum of deposition amount of Co and Ni in the surface treatment layer is 3500 μg/dm² or less.

According to yet another embodiment of the surface treated copper foil of the present disclosure, after preparing the surface treated copper foil and a resin, and laminating the surface treated copper foil, from the side of the surface treatment layer, with the resin, a peel strength at the time of peeling of the surface treated copper foil from the resin is 0.5 kg/cm or more.

According to yet another embodiment of the surface treated copper foil of the present disclosure, the peel strength is 0.7 kg/cm or more.

According to yet another embodiment of the surface treated copper foil of the present disclosure, the surface treatment layer has either one or both of the following (A) and (B) on or over the primary particle layer or on or over the secondary particle layer.

(A) An alloy layer comprising Ni, and one or more elements selected from the group consisting of Fe, Cr, Mo, Zn, Ta, Cu, Al, P, W, Mn, Sn, As and Ti (B) A chromate treatment layer According to yet another embodiment of the surface treated copper foil of the present disclosure, the surface treatment layer has at either one or both of the following (A) and (B) on or over the primary particle layer or on or over the secondary particle layer, and the surface treatment layer has the following (C) on or over the primary particle layer or on or over the secondary particle layer.

(A) An alloy layer comprising Ni, and one or more elements selected from the group consisting of Fe, Cr, Mo, Zn, Ta, Cu, Al, P, W, Mn, Sn, As and Ti (B) A chromate treatment layer (C) a silane coupling treatment layer According to yet another embodiment of the surface treated copper foil of the present disclosure, the surface treatment layer has one of a Ni—Zn alloy layer and a chromate treatment layer, or has both the two layers in this order from the side of the copper foil, on or over the primary particle layer or on or over the secondary particle layer.

According to yet another embodiment of the surface treated copper foil of the present disclosure, the surface treatment layer has at one of a Ni—Zn alloy layer and a chromate treatment layer, or has both two layers, and the surface treatment layer has a silane coupling treatment layer, in this order from the side of the copper foil, on or over the primary particle layer or on or over the secondary particle layer.

According to yet another embodiment of the surface treated copper foil of the present disclosure, the surface treated copper foil has a resin layer on a surface of the surface treatment layer.

According to yet another embodiment of the surface treated copper foil of the present disclosure, the surface treated copper foil is for the use of a high frequency substrate.

According to yet another aspect, the present disclosure is a copper foil with carrier, wherein the carrier has an intermediate layer and an ultra-thin copper layer in this order on one or both sides of the carrier, wherein the ultra-thin copper layer is the surface treated copper foil according to the present disclosure.

According to yet another aspect, the present disclosure is a laminate, comprising the surface treated copper foil according to the present disclosure, or the copper foil with carrier according to the present disclosure.

According to yet another aspect, the present disclosure is a laminate comprising the copper foil with carrier according to the present disclosure and a resin, wherein a part or the whole of an end face of the copper foil with carrier is covered with the resin.

According to yet another aspect, the present disclosure is a laminate comprising one copper foil with carrier according to the present disclosure, and another copper foil with carrier according to the present disclosure, wherein one copper foil with carrier is laminated, from the side of the carrier or the copper foil thereof, with the other copper foil with carrier, from the side of the carrier or the copper foil thereof.

According to yet another aspect, the present disclosure is a method for manufacturing a printed wiring board, using the surface treated copper foil according to the present disclosure, or the copper foil with carrier according to the present disclosure.

According to yet another aspect, the present disclosure is a method for manufacturing a printed wiring board, comprising a step of preparing the surface treated copper foil according to the present disclosure, or the copper foil with carrier according to the present disclosure, and an insulating substrate; a step of forming a copper clad laminate by laminating the surface treated copper foil and the insulating substrate, or forming a copper clad laminate by laminating the copper foil with carrier and the insulating substrate, and then peeling off the carrier of the copper foil with carrier; and a step of forming a circuit by a semi-additive method, a subtractive method, a partly additive method or a modified semi-additive method using the copper clad laminate.

According to yet another aspect, the present disclosure is a method for manufacturing a printed wiring board, comprising a step of a step of forming a circuit on the surface of the side of the surface treatment layer of the surface treated copper foil according to the present disclosure, or forming a circuit on the surface of the side of the ultra-thin copper layer or the surface of the side of the carrier of the copper foil with carrier according to the present disclosure; a step of forming a resin layer on the surface of the side of the surface treatment layer of the surfaced treated copper foil, or on the surface of the side of the ultra-thin copper layer or the surface of the side of the carrier of the copper foil with the carrier, so that the circuit is embedded in the resin layer; and after forming the resin layer, a step of exposing the circuit embedded in the resin layer by removing the surface treated copper foil, or by peeling off the carrier or the ultra-thin copper layer and then removing the ultra-thin copper layer or the carrier.

According to yet another aspect, the present disclosure is a method for manufacturing a printed wiring board, comprising a step of laminating the copper foil with carrier according to the present disclosure, on the surface of side of the carrier or on the surface of the side of the ultra-thin copper layer, with a resin substrate; a step of forming, at least once, two layers consisting of a resin layer and a circuit, on the surface of the copper foil with carrier, the surface being on the side opposite to the side on which the resin substrate is laminated; and after forming the two layers consisting of the resin layer and the circuit, a step of peeling off the carrier or the ultra-thin copper layer from the copper foil with carrier.

According to yet another aspect, the present disclosure is a method for manufacturing a printed wiring board, comprising a step of forming, at least once, two layers consisting of a resin layer and a circuit, on one side or both sides of the laminate according to the present disclosure; and after forming the two layers consisting of the resin layer and the circuit, a step of peeling off the carrier or the ultra-thin copper layer from the copper foil with carrier constituting the laminate.

According to yet another aspect, the present disclosure is a method for manufacturing an electronic device, using a printed wiring board manufactured by the method according to the present disclosure.

Advantageous Effect of Embodiments

According to the present disclosure, it is possible to provide a surface treated copper foil capable of favorably reducing the transmission loss even when used in a high frequency circuit substrate, and after laminating the surface treated copper foil with a resin, heating at a predetermined temperature for a predetermined time (at 180° C. for 10 days), the peel strength of the surface treated copper foil and the resin is favorable.

DESCRIPTION OF EMBODIMENTS

<Surface Treated Copper Foil>

Figure 1:
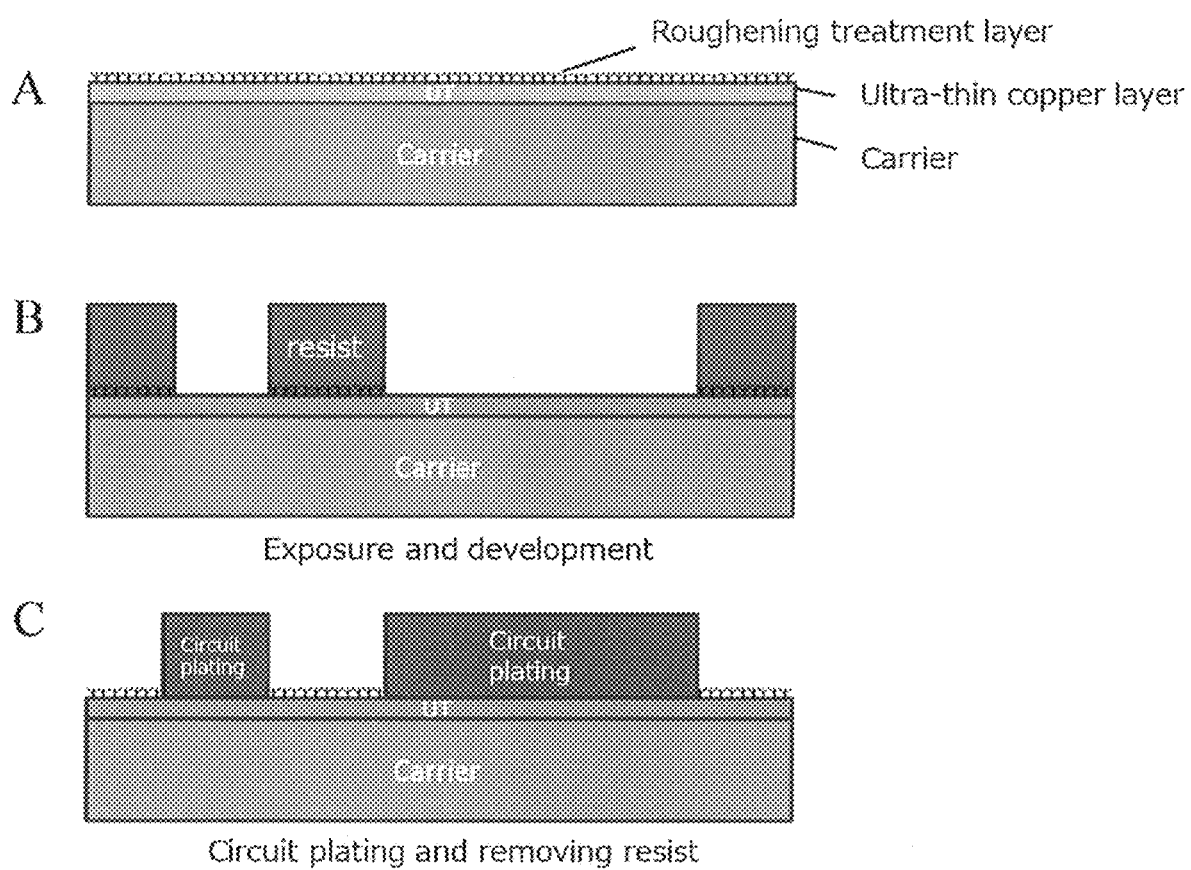
FIG. 1 A to C are schematic diagrams of a cross section of a wiring board in a process until circuit plating and removing resist, according to one embodiment of the method for manufacturing a printed wiring board using the copper foil with carrier according to the present disclosure.

According to the surface treated copper foil of the present disclosure, a surface treatment layer is provided on one or both surfaces of a copper foil. By bonding the surface treated copper foil according to the present disclosure to an insulating substrate, and etching the surface treated copper foil into a target conductor pattern, a printed wiring board can be finally manufactured. The surface treated copper foil according to the present disclosure may be used as a surface-treated copper foil for a high frequency circuit board. Here, the high frequency circuit board refers to a circuit board having a signal of 1 GHz or more frequency transmitted using the circuit of the circuit board. Preferably, the frequency of the signal is 3 GHz or higher, more preferably 5 GHz or higher, more preferably 8 GHz or higher, more preferably 10 GHz or higher, more preferably 15 GHz or higher, more preferably 18 GHz or higher, more preferably 20 GHz or higher, and still more preferably Is 30 GHz or higher, more preferably 38 GHz or higher, and more preferably 40 GHz or higher.

<Copper Foil>

There is no particular limitation on the form of the copper foil which can be used in the present disclosure. Typically, the copper foil used in the present disclosure may be either an electrolytic copper foil or a rolled copper foil. Generally, an electrolytic copper foil is manufactured by electrodepositing copper on a titanium drum or a stainless drum from in copper sulfate plating bath, and a rolled copper foil is manufactured by repeating plastic working with a rolling roll and heat treatment. Rolled copper foil is often used for applications requiring flexibility.

As to the copper foil material, high purity copper such as tough pitch copper (JIS H 3100 alloy number C1100) or oxygen free copper (JIS H 3100 alloy number C1020 or JIS H 3510 alloy number C1011) or phosphorus deoxidized copper (JIS H3100 alloy number C1201, C1220 or C1221) or electrolytic copper are normally used for the conductor pattern of printed wiring boards. Besides, for example, copper containing Sn, copper containing Ag, copper alloy to which Cr, Fe, P, Ti, Sn, Zn, Mn, Mo, Co, Ni, Si, Zr and/or Mg etc. are added, or Corson type copper alloy to which Ni, Si and the like are added, also can be used. Copper foils and copper alloy foils having known compositions can also be used. Incidentally, in this specification, when the term "copper foil" is used alone, it also includes a copper alloy foil.

Besides, although the thickness of the copper foil is not particularly limited, it is preferably in the range of 1 to 1000 μm, or 1 to 500 μm, or 1 to 300 μm, or 3 to 100 μm, or 5 to 70 μm, or 6 to 35 μm, or 9 to 18 μm.

Further, according to another aspect, the present disclosure is a copper foil with carrier comprising a carrier, an intermediate layer, an ultra-thin copper layer in this order on one or both surfaces of the carrier, wherein the ultra-thin copper layer is the surface treated copper foil according to the present disclosure. According to the present disclosure, when using a copper foil with carrier, a surface treatment layer such as a roughening treatment layer described later is provided on the surface of the ultra-thin copper layer. Other embodiments of a copper foil with carrier will also be described later.

<Surface Treatment Layer>

The surface treatment layer has a primary particle layer, or the surface treatment layer has a primary particle layer and a secondary particle layer in this order from the side of the copper foil. The primary particle layer and the secondary particle layer are formed by an electroplating layer. A feature of this secondary particle is that one or a plurality of particles grown on a primary particle. Or the secondary particle layer is a normal plating grown on the primary particles. The secondary particles may have a dendritic shape. In other words, when the term "secondary particle layer" is used in the present specification, a normal plating layer such as covering plating is also included. Further, the secondary particle layer may be a layer having one or more layers formed by roughening particles, or may be a layer having one or more normal plating layers, and may be a layer having respectively one or more layers formed by roughening particles and one or more normal plating layers. Further, the surface treatment layer may have one or more other layers other than the primary particle layer and the secondary particle layer.

Besides, the primary particle layer is a layer containing roughening particles formed directly on the copper foil and roughening particles stacked on the roughening particles formed directly on the copper foil, wherein the stacked roughening particles have the same composition as the roughening particles formed directly on the copper foil or have the same element as the element contained in the roughening particles directly formed on the copper foil. The secondary particle layer is a layer containing roughening particles, which are formed on or above the roughening particles contained in the primary particle layer and have a composition different from that of the roughening particles forming the primary particle layer, or contain an element(s) not contained in the roughening particles forming the primary particle layer.

When it is not possible to measure the presence or absence of the element(s) constituting the above-mentioned primary particles and/or secondary particles and/or when it is not possible to measure the concentration or deposition amount of the above-mentioned element(s), the primary particles and the secondary particles can be determined in the manner that, when observed by, for example, a scanning electron microscope photograph, the particles which are seen as overlapping (or superposed) and exist on the copper foil side (lower side) and the non-overlapping particles are regarded as primary particles, and those which are overlapping (or superposed) and exist on other particles are regarded as secondary particles.

According to one aspect of the surface treated copper foil of the present disclosure, the surface treatment layer contains Zn, and the deposition amount of Zn in the surface treat layer is 150 $\mu g/dm^2$ or more. If the deposition amount of Zn is less than 150 $\mu g/dm^2$, the heat resistance may be poor when used as a surface treated copper foil for a high frequency circuit board. The deposition amount of Zn is preferably 155 $\mu g/dm^2$ or more, preferably 165 $\mu g/dm^2$ or more, preferably 180 $\mu g/dm^2$ or more, preferably 200 $\mu g/dm^2$ or more, preferably 250 $\mu g/dm^2$ or more, preferably 270 $\mu g/dm^2$ or more, preferably 280 $\mu g/dm^2$ or more, still more preferably 290 $\mu g/dm^2$ or more. The upper limit of the deposition amount of Zn is not particularly limited, but is typically 50000 $\mu g/dm^2$ or less, for example, 30000 $\mu g/dm^2$ or less, for example, 10000 $\mu g/dm^2$ or less, for example 5000 $\mu g/dm^2$ or less, for example 3000 $\mu g/dm^2$ or less, 2000 $\mu g/dm^2$ or less, for example, 1000 $\mu g/dm^2$ or less.

Moreover, in the present disclosure, the deposition amount of elements such as Zn, Ni, Co, and Mo in the surface treatment layer is defined, but when the surface treatment layer are present on both surfaces of the copper foil, the definitions are related to the surface treatment layer on one surface, but not a total value of elements (for example, Zn or the like) contained in the surface treatment layers formed on both surfaces.

According to another aspect of the surface treated copper foil of the present disclosure, the surface treatment layer contains Zn and Mo, and a sum of deposition amount of Zn and Mo in the surface treatment layer is 200 $\mu g/dm^2$ or more. If the sum of the deposition amount of Zn and Mo is less than 200 $\mu g/dm^2$, the heat resistance may be poor when used as a surface treated copper foil for a high frequency circuit board. The sum of the deposition amount of Zn and Mo is preferably 250 $\mu g/dm^2$ or more, more preferably 300 $\mu g/dm^2$ or more, more preferably 340 $\mu g/dm^2$ or more, more preferably 360 $\mu g/dm^2$ or more, more preferably 400 $\mu g/dm^2$ or more, more preferably 420 $\mu g/dm^2$ or more, more preferably 450 $\mu g/dm^2$ or more, more preferably 460 $\mu g/dm^2$ or more, and more preferably 500 $\mu g/dm^2$ or more. The upper limit of the sum of the deposition amount of Zn and Mo is not particularly limited, but is typically, for example, 100000 $\mu g/dm^2$ or less, for example, 50000 $\mu g/dm^2$ or less, for example, 30000 $\mu g/dm^2$ or less, for example, 10000 $\mu g/dm^2$ or less, for example 8000 $\mu g/dm^2$ or less, for example, 5000 $\mu g/dm^2$ or less, for example, 3000 $\mu g/dm^2$ or less, for example, 1000 $\mu g/dm^2$ or less.

According to the present disclosure, the surface treatment layer does not contain Co, or when the surface treatment layer contains Co, a deposition amount of Co in the surface treatment layer is 3000 $\mu g/dm^2$ or less. When the deposition amount of Co exceeds 3000 $\mu g/dm^2$, there is a possibility that the high frequency transmission characteristic deteriorates. The deposition amount of Co is more preferably 2900 $\mu g/dm^2$ or less, more preferably 2800 $\mu g/dm^2$ or less, more preferably 2790 $\mu g/dm^2$ or less, more preferably 2700 $\mu g/dm^2$ or less, more preferably 2500 $\mu g/dm^2$ or less, still more preferably Is 1500 $\mu g/dm^2$ or less, still more preferably 1000 $\mu g/dm^2$ or less. In the case where the surface treatment layer contains Co, the lower limit of the deposition amount of Co in the surface treatment layer is not particularly limited, but typically, for example, the deposition amount of Co is larger than 0 $\mu g/dm^2$, for example, 0.10 $\mu g/dm^2$ or more, for example, 1 $\mu g/dm^2$ or more, for example, 2 $\mu g/dm^2$ or more, for example, 3 $\mu g/dm^2$ or more, for example, 4 $\mu g/dm^2$ or more, for example, 5 $\mu g/dm^2$ or more, for example, 10 $\mu g/dm^2$ or more, for example, 15 $\mu g/dm^2$ or more, for example, 20 $\mu g/dm^2$ or more. Further, when the surface treatment layer contains Co, the weather resistance of the surface treated copper foil may be improved compared with the case where Co is not contained.

According to the present disclosure, the surface treatment layer does not contain Ni, or when the surface treatment layer contains Ni, a deposition amount of Ni in the surface treatment layer is 800 $\mu g/dm^2$ or less. When the deposition amount of Ni exceeds 800 $\mu g/dm^2$, there is a possibility of causing a problem that the high frequency transmission characteristics deteriorate. The deposition amount of Ni is more preferably 750 $\mu g/dm^2$ or less, more preferably 600 $\mu g/dm^2$ or less, more preferably 400 $\mu g/dm^2$ or less, more preferably 250 $\mu g/dm^2$ or less. In the case where the surface treatment layer contains Ni, the lower limit of the deposition amount of Ni in the surface treatment layer is not particularly limited, but typically, for example, the deposition amount of Ni is larger than 0 $\mu g/dm^2$, for example, 0.10 $\mu g/dm^2$ or more, for example, 1 $\mu g/dm^2$ or more, for example, 2 $\mu g/dm^2$ or more, for example, 3 $\mu g/dm^2$ or more, for example, 4 $\mu g/dm^2$ or more, for example, 5 $\mu g/dm^2$ or more, for example, 10 $\mu g/dm^2$ or more, for example, 15 $\mu g/dm^2$ or more, for example, 20 $\mu g/dm^2$ or more. Further, when the surface treatment layer contains Ni, the chemical resistance of the surface treated copper foil may be improved compared with the case where Ni is not contained.

According to the present disclosure, it is preferable that the surface treatment layer contains Co and Ni, and a sum of the deposition amount of Co and Ni in the surface treatment layer is 3500 µg/dm² or less. When the sum of the deposition amount of Co and Ni exceeds 3500 µg/dm², there is a possibility of causing a problem that the high frequency transmission characteristics deteriorate. The sum of the deposition amount of Co and Ni is more preferably 3100 µg/dm² or less, still more preferably 1900 µg/dm² or less, still more preferably 1400 µg/dm² or less. In the case where the surface treatment layer contains Co and Ni, the lower limit of the sum of the deposition amount of Co and Ni in the surface treatment layer is not particularly limited, but typically the sum of the deposition amount of Co and Ni is more than 0 µg/dm², for example, 0.10 µg/dm² or more, for example, 1 µg/dm² or more, for example, 2 µg/dm² or more, for example, 3 µg/dm² or more, for example, 4 µg/dm² or more, for example, 5 µg/dm² or more, for example, 10 µg/dm² or more, 15 µg/dm² or more, for example, 20 µg/dm² or more, for example, 30 µg/dm² or more, for example, 40 µg/dm² or more, for example, 50 µg/dm² or more, for example, 60 µg/dm² or more, for example 70 µg/dm² or more. Further, when the surface treatment layer contains Co and Ni, the chemical resistance and the weather resistance of the surface treated copper foil may be improved compared with the case where Co and Ni is not contained.

Further, the amount of the element contained in the surface treatment layer can be increased by increasing the concentration of the element in the surface treatment solution used for forming the surface treatment layer, and/or when the surface treatment is plating, by increasing the current density and/or by increasing the surface treatment time (energization time in plating), or the like. Further, the amount of the element contained in the surface treatment layer can be decreased by decreasing the concentration of the element in the surface treatment solution used for forming the surface treatment layer, and/or when the surface treatment is plating, by lowering the current density and/or by shortening the surface treatment time (energization time in plating), or the like.

According to the surface treat copper foil of the present disclosure, a ten point average roughness Rz of the outermost surface of the surface treatment layer is 1.5 µm or less. When the ten point average roughness Rz of the outermost surface of the surface treatment layer exceeds 1.5 µm, there is a possibility of causing a problem that the high frequency transmission characteristics deteriorate. The ten point average roughness Rz of the outermost surface of the surface treatment layer is more preferably 1.3 µm or less, still more preferably 1.1 µm or less, still more preferably 1.0 µm or less, still more preferably 0.9 µm or less. When a surface treatment layer is formed by a plurality of layers formed by surface treatment, the "outermost surface of the surface treatment layer" means the surface of the outermost layer of the plurality of layers. And the ten point average roughness Rz is measured with respect to the surface of the outermost layer of the plurality of layers. The lower limit of the ten point average roughness Rz of the outermost surface of the surface treatment layer is not particularly limited, but is typically 0.01 µm or more, for example, 0.05 µm or more, for example, 0.1 µm or more.

According to the present disclosure, the surface treatment layer may have either one or both of the following (A) and (B) in this order on or over the primary particle layer or on or over the secondary particle layer.

(A) An alloy layer comprising Ni, and one or more elements selected from the group consisting of Fe, Cr, Mo, Zn, Ta, Cu, Al, P, W, Mn, Sn, As and Ti (B) A chromate treatment layer Furthermore, according to the present disclosure, the surface treatment layer may have at least one of the following (A) and (B) on or over the primary particle layer or on or over the secondary particle layer, and the surface treatment layer has a silane coupling treatment layer in this order on or over the primary particle layer or on or over the secondary particle layer.

(A) An alloy layer comprising Ni, and one or more elements selected from the group consisting of Fe, Cr, Mo, Zn, Ta, Cu, Al, P, W, Mn, Sn, As and Ti (B) A chromate treatment layer Furthermore, according to the surface treated copper foil of the present disclosure, the surface treatment layer may have one of a Ni—Zn alloy layer and a chromate treatment layer, or have both the two layers in this order from the side of the copper foil, on or over the primary particle layer or on or over the secondary particle layer.

Furthermore, according to the surface treated copper foil of the present disclosure, the surface treatment layer may have at one of a Ni—Zn alloy layer and a chromate treatment layer or have both two layers, and have a silane coupling treatment layer, in this order from the side of the copper foil, on or over the primary particle layer or on or over the secondary particle layer.

Note that the above-mentioned Ni—Zn alloy layer refers to a layer of an alloy containing Ni and Zn. The Ni—Zn alloy layer may be a layer in which the total concentration of Ni and Zn is 80 atom % or more. The total concentration of Ni and Zn can be measured by atomic concentration analysis of Ni and Zn in the depth direction using XPS or the like and adding the obtained Ni atom concentration and Zn atom concentration together. The Ni—Zn alloy layer may be a layer composed only of Ni and Zn.

According to the surface treated copper foil of the present disclosure, after laminating the surface treated copper foil, from the side of the surface treatment layer, with a resin, etching the surface treated copper foil and forming a copper wiring (a circuit) having a width of 10 mm, a peel strength at the time of peeling off the circuit from the resin in a 90° direction of 0.5 kg/cm or more can be achieved, and further a peel strength of 0.7 kg/cm or more may be achieved.

Further, according to the surface treated copper foil of the present disclosure, after laminating the surface treated copper foil, from the side of the surface treatment layer, with a resin, etching the surface treated copper foil and forming a copper wiring (a circuit) having a width of 10 mm, and heating the circuit under the atmosphere at 180° C. for 10 days, a peel strength at the time of peeling off the circuit from the resin in a 90° direction of 0.4 kg/cm or more can be achieved, and further a peel strength of 0.5 kg/cm or more may be achieved.

In addition, the above-mentioned resin and the conditions for the lamination are any one, two or three of the following (1) to (3). That is, it is preferable that the peel strength obtained based on any one of the following conditions (1) to (3) is within the above range.

(1) The resin: liquid crystal polymer resin that is a copolymer of hydroxybenzoic acid and hydroxynaphthoic acid, thickness of 50 µm The conditions for the lamination: pressure 3.5 MPa, heating temperature 300° C., heating time 10 minutes (2) The resin: low dielectric polyimide resin, thickness 50 μm The conditions for the lamination: pressure 4 MPa, heating temperature 360° C., heating time 5 minutes (3) The resin: polytetrafluoroethylene, thickness 50 μm The conditions for the lamination: pressure 5 MPa, heating temperature 350° C., heating time 30 minutes <Transmission Loss>

When the transmission loss is small, attenuation of the signal at the time of signal transmission at high frequencies is suppressed, so that a stable signal transmission can be performed in a circuit that transmits signals at high frequencies. Therefore, it is preferable that the value of the transmission loss is smaller because it is suitable for use in a circuit for transmitting signals at high frequencies. When the surface treated copper foil was laminated to a commercially available liquid crystal polymer resin (Vecstar CTZ, thickness 50 μm, made by KURARAY CO., LTD., resin which is a copolymer of hydroxybenzoic acid (ester) and hydroxynaphthoic acid (ester)), and a microstrip line was formed by etching so as to have a characteristic impedance of 50Ω, transmission coefficients can be measured using a network analyzer HP 8720 C manufactured by HP Co., Ltd. to determine a transmission loss at a frequency of 20 GHz and a frequency of 40 GHz, and the transmission loss at a frequency of 20 GHz is preferably less than 5.0 dB/10 cm, more preferably less than 4.1 dB/10 cm, still more preferably less than 3.7 dB/10 cm.

According to another embodiment, the present disclosure is a copper foil with carrier, wherein the carrier has an intermediate layer and an ultra-thin copper layer in this order on one or both sides of the carrier, wherein the ultra-thin copper layer is the surface treated copper foil according to one embodiment of the present disclosure.

<Carrier>

The carrier that can be used in the present disclosure is typically a metal foil or a resin film, for example, a copper foil, a copper alloy foil, a nickel foil, a nickel alloy foil, an iron foil, an iron alloy foil, a stainless foil, an aluminum foil, an aluminum alloy foil, an insulating resin film, a polyimide film, an LCP (liquid crystal polymer) film, a fluororesin film, a PET (polyethylene terephthalate) film, a PP (polypropylene) film, a polyamide film, and a polyamideimide film can be provided.

The carrier that can be used in the present disclosure is typically provided in the form of a rolled copper foil or an electrolytic copper foil. Generally, an electrolytic copper foil is manufactured by electrodepositing copper on a titanium drum or a stainless drum from in copper sulfate plating bath, and a rolled copper foil is manufactured by repeating plastic working with a rolling roll and heat treatment. Besides, as a material of the copper foil, other than high purity copper such as tough pitch copper (JIS H 3100 alloy number C1100) or oxygen free copper (JIS H 3100 alloy number C1020 or JIS H 3510 alloy number C1011) or phosphorus deoxidized copper or electrolytic copper, for example, copper containing Sn, copper containing Ag, copper alloy to which Cr, Zr, Mg or the like is added, or Corson type copper alloy to which Ni, Si and the like are added, also can be used. Incidentally, in this specification, when the term "copper foil" is used alone, it also includes a copper alloy foil.

The thickness of the carrier that can be used in the present disclosure is also not particularly limited, but it may be appropriately adjusted to a thickness suitable for fulfilling its role as a carrier, for example, it may be 5 μm or more. Meanwhile, if it is too thick, the production cost will be high, so it is generally preferable to set the thickness of the carrier to 35 μm or less. Accordingly, the thickness of the carrier is typically 8 to 70 μm, more typically 12 to 70 μm, more typically 18 to 35 μm. From the viewpoint of reducing raw material cost, it is preferable that the thickness of the carrier be small. Therefore, the thickness of the carrier is typically 5 μm or more and 35 μm or less, preferably 5 μm or more and 18 μm or less, preferably 5 μm or more and 12 μm or less, preferably 5 μm or more and 11 μm or less, preferably 5 μm or more and 10 μm or less. Besides, when the thickness of the carrier is too small, fold wrinkles are likely to occur at the time of passing the carrier. In order to prevent the occurrence of fold wrinkles, it is effective to, for example, smooth the conveyance roll of the manufacturing apparatus for the copper foil with carrier, or shorten the distance between the conveyance roll and the next conveyance roll. Further, in the cases in which the carrier foil with carrier is used in an embedding process, which is one of the methods for manufacturing a printed wiring board, it is necessary that the carrier has high rigidity. Therefore, when used in the embedding method, the thickness of the carrier is preferably 18 μm or more and 300 μm or less, more preferably 25 μm or more and 150 μm or less, more preferably 35 μm or more and 100 μm or less, and sill more preferably 35 μm or more and 70 μm or less.

Further, it is possible to provide a primary particle layer and a secondary particle layer on the surface of the carrier, the surface being the surface of the side opposite to the side on which the ultra-thin copper foil is provided. By providing the primary particle layer and the secondary particle layer on the carrier's surface of the side opposite to the side on which the ultra-thin copper foil is provided, there is an advantage that, when the carrier is laminated on a support such as a resin substrate from the surface side having the primary particle layer and the secondary particle layer, it is difficult for the carrier to peel from the resin substrate An example of manufacturing conditions in the case where an electrolytic copper foil is used as a carrier is described below.

<Composition of Electrolytic Solution>

Copper: 90 to 110 g/L

Sulfuric acid: 90 to 110 g/L

Chlorine: 50 to 100 ppm

Leveling agent 1 (bis(3-sulfopropyl)disulfide): 10 to 30 ppm

Leveling agent 2 (amine compound): 10 to 30 ppm

For the amine compound, an amine compound having the following chemical formula can be used.

Besides, the remainder of the treatment liquid used for electrolysis, surface treatment, plating or the like used according to the present disclosure is water unless otherwise specified.

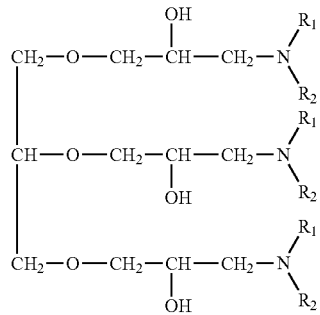

[Chemical formula 1]

(in the chemical formula, $R^1$ and $R^2$ are respectively a group selected from the group consisting of a hydroxyalkyl group, an ether group, an aryl group, an aromatic substituted alkyl group, an unsaturated hydrocarbon group, and an alkyl group.)

<Production Conditions>

Current density: 70 to 100 A/dm$^2$
Electrolyte temperature: 50 to 60° C.
Linear speed of electrolyte: 3 to 5 m/sec
Electrolysis time: 0.5 to 10 minutes <Intermediate Layer>

An intermediate layer is provided on the carrier. Besides, another layer (or layers) may be provided between the carrier and the intermediate layer. The intermediate layer used in the present disclosure is not particularly limited as long as the intermediate layer has a constitution such that the ultra-thin copper layer hard to peel from the carrier before the step of laminating the copper foil with carrier on an insulating substrate, and on the other hand, after the step of laminating on the insulating substrate, the ultra-thin copper layer is allowed to be peeled from the carrier. For example, the intermediate layer of the copper foil with carrier of the present disclosure may include one or two or more selected from the group consisting of Cr, Ni, Co, Fe, Mo, Ti, W, P, Cu, Al, Zn, one alloy or more alloys containing one or two or more selected from the group consisting of Cr, Ni, Co, Fe, Mo, Ti, W, P, Cu, Al, Zn, one hydrate or more hydrates containing one or two or more selected from the group consisting of Cr, Ni, Co, Fe, Mo, Ti, W, P, Cu, Al, Zn, one oxide or more oxides containing one or two or more selected from the group consisting of these and one organic substance or more organic substances. In addition, the intermediate layer may be composed of two or more layers.

Further, for example, the intermediate layer can be constituted by forming, from the carrier side, a single metal layer composed of one element selected from the element group consisting of Cr, Ni, Co, Fe, Mo, Ti, W, P, Cu, Al and Zn, or by forming an alloy layer composed of one or two or more elements selected from the element group consisting of Cr, Ni, Co, Fe, Mo, Ti, W, P, Cu, Al and Zn, and then forming, on the top of the single metal layer or the alloy layer, a layer composed of one hydrate or more hydrates or one oxide or more oxides of one or two or more elements selected from the element group consisting of Cr, Ni, Co, Fe, Mo, Ti, W, P, Cu, Al and Zn, or a layer composed of one organic substance or more organic substances, or a single metal layer composed of one element selected from the element group consisting of Cr, Ni, Co, Fe, Mo, Ti, W, P, Cu, Al and Zn, or an alloy layer composed of one or two or more elements selected from the element group consisting of Cr, Ni, Co, Fe, Mo, Ti, W, P, Cu, Al and Zn.

When the intermediate layer is provided only on one side, it is preferable to provide a rust preventive layer such as a Ni plating layer on the opposite side of the carrier. When the intermediate layer is provided by chromate treatment, zinc chromate treatment or plating treatment, it is considered that some of the attached metal such as chromium and zinc may be in the form of hydrates or oxides.

In addition, for example, the intermediate layer can be constituted by laminating, on the carrier, nickel, a nickel-phosphorus alloy (or a nickel-cobalt alloy), and chromium in this order. The adhesion between nickel and copper is higher than the adhesion between chromium and copper, and hence, when peeling off the ultra-thin copper layer, peeling occurs between the ultra-thin copper layer and chromium. For the nickel in the intermediate layer, the barrier effect of preventing the diffusion of the copper component from the carrier to the ultra-thin copper layer is expected. The deposition amount of nickel in the intermediate layer is preferably 100 µg/dm$^2$ or more and 40000 µg/dm$^2$ or less, more preferably 100 µg/dm$^2$ or more and 4000 µg/dm$^2$ or less, more preferably 100 µg/dm$^2$ or more and 2500 µg/dm$^2$ or less, and more preferably 100 µg/dm$^2$ or more and 1000 µg/dm$^2$ or less; the deposition amount of chromium in the intermediate layer is preferably 5 µg/dm$^2$ or more and 100 µg/dm$^2$ or less.

<Ultra-Thin Copper Layer>

An Ultra-thin copper layer is provided on the intermediate layer. Besides, another layer (or layers) may be provided between the intermediate layer and the ultra-thin copper layer. The ultra-thin copper layer can be formed by electroplating using an electrolytic bath such as copper sulfate, copper pyrophosphate, copper sulfamate, copper cyanide, etc. A copper sulfate bath, which is used in ordinary electrolytic copper foil and is capable of forming a copper foil at high current density, is preferred. The thickness of the ultra-thin copper layer is not particularly limited, but is generally thinner than the carrier, for example, 12 µm or less. The thickness of the ultra-thin copper layer is typically 0.5 to 12 µm, more typically 1 to 5 µm, more typically 1.5 to 5 µm, still more typically 2 to 5 µm. Further, the ultra-thin copper layers may be provided on both sides of the carrier.

<Formation Conditions for Primary Particle Layer and Secondary Particle Layer>

A primary particle layer is formed, or a primary particle layer and a secondary particle layer are formed in this order, in the case of a surface treated copper foil, on the copper foil, or in the case of a copper foil with a carrier, on the ultra-thin copper foil. The conditions for forming the primary particle layer and the secondary particle layer are shown below, but this is merely a preferable example, and any plating conditions other than those indicated below may be used without any problem as long as an adhesion strength with the resin to be used is sufficient, for example, a range of 0.5 kg/cm or more in initial peel. One or more embodiments of the present invention includes these conditions.

Primary Particle Layer

In the case of treating with a primary particle plating solution (I) and subsequently treating with a primary particle plating solution (I), it is possible to form a primary particle layer under the following conditions.

(Treatment with Primary Particle Plating Solution (I))

<Composition of Electrolytic Solution>

Copper: 5 to 10 g/L
Sulfuric acid: 70 to 80 g/L

<Production Conditions>

Current density: 50 to 55 A/dm$^2$
Electrolyte temperature: 35° C.
Electrolysis time: 0.5 to 1.6 seconds (Treatment with Primary Particle Plating Solution (II))

<Composition of Electrolytic Solution>

Copper: 20 to 50 g/L
Sulfuric acid: 60 to 100 g/L

<Production Conditions>

Current density: 4 to 10 A/dm$^2$
Electrolyte temperature: 35 to 45° C.
Electrolysis time: 1.4 to 2.5 seconds In the case of forming a primary particle layer only by treatment with a primary particle plating solution (I), the treatment can be carried out under the conditions described in the following treatment 1 by the primary particle plating solution (I) or treatment 2 by the primary particle plating solution (I).

(Treatment 1 with Primary Particle Plating Solution (I))
<Composition of Electrolytic Solution>
  Copper: 10 to 45 g/L
  Cobalt: 5 to 30 g/L
  Nickel: 5 to 30 g/L
  pH: 2.8 to 3.2
<Production Conditions>
  Current density: 30 to 45 A/dm$^2$
  Electrolyte temperature: 30 to 40° C.
  Electrolysis time: 0.3 to 0.8 seconds
(Treatment 2 with Primary Particle Plating Solution (I))
<Composition of Electrolytic Solution>
  Copper: 5 to 15 g/L
  Nickel: 3 to 30 g/L
  pH: 2.6-3.0
<Production Conditions>
  Current density: 50 to 70 A/dm$^2$
  Electrolyte temperature: 30 to 40° C.
  Electrolysis time: 0.3 to 0.9 seconds
  Secondary Particle Layer
  In the case of forming a secondary particle layer, it can be carried out by treatment with the following secondary particle plating solution (I) or secondary particle plating solution (II).
(Treatment with Secondary Particle Plating Solution (I))
<Composition of Electrolytic Solution>
  Copper: 10 to 15 g/L
  Cobalt: 5 to 15 g/L
  Nickel: 5 to 15 g/L
  pH: 2.8 to 3.2
<Production Conditions>
  Current density: 30 to 35 A/dm$^2$
  Electrolyte temperature: 33 to 37° C.
  Electrolysis time: 0.5 to 1.0 seconds
(Treatment with Secondary Particle Plating Solution (II))
<Composition of Electrolytic Solution>
  Copper: 5 to 12 g/L
  Nickel: 2 to 11 g/L
  PH: 2.8
<Production Conditions>
  Current density: 55 to 65 A/dm$^2$
  Electrolyte temperature: 35 to 40° C.
  Electrolysis time: 0.3 to 0.9 seconds
<Cover Plating>

Cover plating is carried out on or over the primary particle layer, or when a secondary particle layer is formed, cover plating is carried out on or over the secondary particle layer. The layer formed by the cover plating can be, for example, a metal layer composed of element selected from the group consisting of Zn, Cr, Ni, Fe, Ta, Cu, Al, P, W, Mn, Sn, As, Ti, or an alloy layer containing two or three or more elements selected from the group consisting of Zn, Cr, Ni, Fe, Ta, Cu, Al, P, W, Mn, Sn, As, Ti, Mo and Co, or an alloy layer composed of two or three or more elements selected from the above element group. For example, the cover plating also can be a Zn—Cr alloy layer, a Ni—Mo alloy layer, a Zn layer, a Co—Mo alloy layer, a Co—Ni alloy layer, a Ni—W alloy layer, a Ni—P alloy layer, a Ni—Fe alloy layer, a Ni—Al alloy layer, a Co—Zn alloy layer, a Co—P alloy layer, a Zn—Co alloy layer, a Ni layer, a Co layer, a Cr layer, a Al layer, a Sn layer, a Sn—Ni layer, a Ni—Sn layer or a Zn—Ni alloy layer or the like.

The cover plating can be carried out by performing treatment with the following cover plating solution or the like, or by combining these. The metal layers and/or the alloy layers which cannot be provided by wet plating can be provided by a dry plating method such as sputtering, physical vapor deposition (PVD), chemical vapor deposition (CVD) or the like.

Treatment with Cover Plating Solution (1) Zn—Cr
  Liquid composition: potassium dichromate 1 to 1 g/L, Zn 0.1 to 5 g/L
  Liquid temperature: 40 to 60° C.
  pH: 0.5 to 10
  Current density: 0.01 to 2.6 A/dm$^2$
  Electrification time: 0.05 to 30 seconds
Treatment with Cover Plating Solution (2) Ni—Mo
  Liquid composition: 270 to 280 g/L of nickel sulfate, 35 to 45 g/L of nickel chloride, 10 to 20 g/L of nickel acetate, 1 to 60 g/L of sodium molybdate, 10 to 50 g/L of trisodium citrate, sodium dodecyl sulfate 50~90 ppm
  Liquid temperature: 20 to 65° C.
  pH: 4 to 12
  Current density: 0.5 to 5 A/dm$^2$
  Electrification time: 0.1 to 5 seconds
Treatment with Cover Plating Solution (3) Zn
  Liquid composition: Zn 1 to 15 g/L
  Liquid temperature: 25 to 50° C.
  pH: 2 to 6
  Current density: 0.5 to 5 A/dm$^2$
  Electrification time: 0.01 to 0.3 seconds
Treatment with Cover Plating Solution (4) Co—Mo
  Liquid composition: 1 to 20 g/L of Co, 1 to 60 g/L of sodium molybdate, 10 to 110 g/L of sodium citrate
  Liquid temperature: 25 to 50° C.
  pH: 5 to 7
  Current density: 1 to 4 A/dm 2
  Electrification time: 0.1 to 5 seconds
Treatment with Cover Plating Solution (5) Co—Ni
  Liquid composition: Co 1 to 20 g/L, N 1 to 20 g/L
  Liquid temperature: 30 to 80° C.
  pH: 1.5 to 3.5
  Current density: 1 to 20 A/dm$^2$
  Energization time: 0.1 to 4 seconds
Treatment with Cover Plating Solution (6) Zn—Ni
  Liquid composition: 1 to 30 g/L of Zn, 1 to 30 g/L of Ni
  Liquid temperature: 40 to 50° C.
  pH: 2 to 5
  Current density: 0.5 to 5 A/dm$^2$
  Electrification time: 0.01 to 0.3 seconds
Treatment with Cover Plating Solution (7) Ni—W
  Liquid composition: Ni 1 to 30 g/L, W 1 to 300 mg/L
  Liquid temperature: 30 to 50° C.
  pH: 2 to 5
  Current density: 0.1 to 5 A/dm$^2$
  Electrification time: 0.01 to 0.3 seconds
Treatment with Cover Plating Solution (8) Ni—P
  Liquid composition: Ni 1 to 30 g/L, P 1 to 10 g/L
  Liquid temperature: 30 to 50° C.
  pH: 2 to 5
  Current density: 0.1 to 5 A/dm$^2$
  Electrification time: 0.01 to 0.3 seconds
<Other Surface Treatment>

After the cover plating, the surface thereof may be subjected to a treatment such as a chromate treatment or a silane coupling treatment. That is, on the surface of the primary particle layer or the secondary particle layer, one or more layers selected from the group consisting of a heat resistant layer, a rust preventive layer, a chromate treatment layer and a silane coupling treatment layer, may be formed. Further, the heat resistant layer, the rust preventive layer, the chromate treatment layer and the silane coupling treatment layer may each have a plurality of layers (for example, two or more layers, three or more layers, etc.).

In this specification, the chromate treatment layer refers to a layer treated with a solution containing chromic anhydride, chromic acid, dichromic acid, chromate or dichromate. The chromate treatment layer may comprise element(s) such as Co, Fe, Ni, Mo, Zn, Ta, Cu, Al, P, W, Sn, As, Ti or the like (the form is not limited and can be metal, alloy, oxide, nitride, sulfide, etc.). Specific examples of the chromate treatment layer include a chromate treatment layer treated with an aqueous solution of chromic anhydride or potassium dichromate, a chromate treatment layer treated with a treatment liquid containing chromic anhydride or potassium dichromate and zinc, and the like.

As the heat resistant layer and the rust preventing layer, a known heat resistant layers and rust preventing layers can be used. For example, the heat resistant layer and/or the rust-preventing layer may be a layer including one or more elements selected from the group consisting of nickel, zinc, tin, cobalt, molybdenum, copper, tungsten, phosphorus, arsenic, chromium, vanadium, titanium, aluminum, gold, silver, platinum group elements, iron and tantalum; or a metal layer or an alloy layer composed of one or more elements selected from the group consisting of nickel, zinc, tin, cobalt, molybdenum, copper, tungsten, phosphorus, arsenic, chromium, vanadium, titanium, aluminum, gold, silver, platinum group elements, iron and tantalum. The heat resistant layer and/or the rust preventing layer may also include an oxide, a nitride and a silicide including the abovementioned element. The heat resistant layer and/or the rust preventing layer may also be a layer including a nickel-zinc alloy. The heat resistant layer and/or the rust preventing layer may also be a nickel-zinc alloy layer. The nickel-zinc alloy layer may be a layer containing 50 wt % to 99 wt % of nickel and 50 wt % to 1 wt % of zinc, zinc, except for inevitable impurities. The total deposition amount of zinc and nickel in the nickel-zinc alloy layer may be 5 to 1000 $mg/m^2$, preferably 10 to 500 $mg/m^2$, and preferably 20 to 100 $mg/m^2$. The ratio between the deposition amount of nickel and the deposition amount of zinc in the nickel-zinc alloy-containing layer or the nickel-zinc alloy layer (=deposition amount of nickel/deposition amount of zinc) is preferably 1.5 to 10. The deposition amount of nickel in the layer including a nickel-zinc alloy or the nickel-zinc alloy layer is preferably 0.5 $mg/m^2$ to 500 $mg/m^2$, and more preferably 1 $mg/m^2$ to 50 $mg/m^2$. In the case where the heat resistant layer and/or the rust preventing layer is a layer including a nickel-zinc alloy, when the inner wall portion of the through-holes, the via holes or the like is brought into contact with the desmear solution, the interface between the copper foil and the resin substrate is hardly corroded by the desmear solution, and the adhesion between the copper foil and the resin substrate is improved.

For example, the heat resistant layer and/or the rust preventive layer may be formed by laminating a nickel or nickel alloy layer having a deposition amount of 1 $mg/m^2$ to 100 $mg/m^2$, preferably 5 $mg/m^2$ to 50 $mg/m^2$ and sequentially a tin layer having a deposition amount of 1 $mg/m^2$ to 80 $mg/m^2$, preferably 5 $mg/m^2$ to 40 $mg/m^2$ in, and the above-mentioned nickel alloy layer may be configured as any one of nickel-molybdenum alloy, nickel-zinc alloy, nickel-molybdenum-cobalt alloy, and nickel-tin alloy.

The silane coupling treatment layer may be formed using a known silane coupling agent or using a silane coupling agent such as an epoxy type silane, an amino type silane, a methacryloxy type silane, a mercapto type silane, a vinyl type silane, an imidazole type silane, a triazine type silane, or the like. Further, two or more of such silane coupling agents may be mixed and used. Among these, a silane coupling treatment layer formed using an amino type silane coupling agent or an epoxy type silane coupling agent is preferable.

Further, on the surfaces of the copper foil, the ultra-thin copper layer, the roughening treatment layer, the heat resistant layer, the rust preventive layer, the silane coupling treatment layer or the chromate treatment layer, other known surface treatment can be performed.

The surface treatment layer according to the present disclosure may include the layer(s) formed by the surface treatment described above. For example, the surface treatment layer according to the present disclosure can include one or a plurality of the above-described cover plating layer(s) and/or metal layer(s) and/or alloy layer(s) and/or heat resistant layer(s) and/or rust preventive layer(s) and/or chromate treatment layer(s), and/or silane coupling treatment layer(s) and/or roughening treatment layer(s).

In this way, a copper foil with carrier having a surface treated copper foil, and/or a carrier, an intermediate layer laminated on the carrier, and an ultra-thin copper layer laminated on the intermediate layer can be manufactured. The method of using the surface treated copper foil and/or the carrier foil with carrier itself is well known to those skilled in the art. For example, the surface of the surface treated copper foil and/or the ultra-thin copper layer can be bonded to an insulating substrate (in the case of a copper foil with carrier, further performing thermocompression bonding and peeling off the carrier) to form a copper clad laminate, and the insulating substrate can be a paper base phenol resin, a paper base epoxy resin, a synthetic fiber cloth base epoxy resin, a glass cloth/paper composite base epoxy resin, a glass cloth/glass nonwoven fabric composite base epoxy resin, a glass cloth base epoxy resin, a polyester film, a polyimide film, liquid crystal polymer, fluororesin, polyamide resin, a low dielectric polyimide film and the like. Then, etching the ultra-thin copper layer adhered to the insulating substrate and/or the ultra-thin copper layer into a target conductor pattern, a printed wiring board can be finally manufactured.

<Resin Layer>

According to the surface treated copper foil of the present disclosure, the surface of the surface treatment layer may have a resin layer. Also, a resin layer may be formed on the surface of an alloy layer comprising Ni and one or more elements selected from the group consisting of Fe, Cr, Mo, Zn, Ta, Cu, Al, P, W, Mn, Sn, As and Ti, or on the surface of a chromate treatment layer, or a silane coupling layer, or a Ni—Zn alloy layer. It is more preferable that the resin layer is formed on the outermost surface of the surface treated copper foil.

The resin layer may be an adhesive or an insulating resin layer in a semi-cured state (B stage) for adhesion. The semi-cured state (B stage) includes the condition wherein, there is no sticky feeling even when it is touched by a finger on its surface, and the insulating resin layer can be stacked and stored, and furthermore a curing reaction occurs when it is subjected to a heat treatment.

The resin layer may contain a thermosetting resin or may be a thermoplastic resin. The resin layer may include a thermoplastic resin. The type of the abovementioned resin is not particularly limited; For example, a resin containing one or more selected from the group consisting of the following resin can be favorably used: epoxy resin, polyimide resin, multifunctional cyanate ester compound, maleimide compound, polymaleimide compound, maleimide resin, aromatic maleimide resin, polyvinyl acetal resin, urethane resin, polyethersulfone, polyethersulfone resin, aromatic polyamide resin, aromatic polyamide resin polymer, rubber resin, polyamine, aromatic polyamine, polyamide imide resin, rubber modified epoxy resin, phenoxy resin, carboxyl group modified acrylonitrile-butadiene resin, polyphenylene oxide, bismaleimide triazine resin, thermosetting polyphenylene oxide resin, cyanate ester type resin, anhydride of carboxylic acid, anhydride of polyvalent carboxylic acid, linear polymer having crosslinkable functional group, polyphenylene ether resin, 2,2-bis(4-cyanatophenyl)propane, phosphorus-containing phenol compound, manganese naphthenate, 2,2-bis(4-glycidyloxyphenyl)propane, polyphenylene ether-cyanate resin, siloxane-modified polyamideimide resin, cyanoester resin, phosphazene type resin, rubber modified polyamide imide resin, isoprene, hydrogenated polybutadiene, polyvinyl butyral, phenoxy, high molecular weight epoxy, aromatic polyamide, fluorine resin, bisphenol, block copolymerized polyimide resin and cyanoester resin Further, the epoxy resin has two or more epoxy groups in the molecule and can be used without any particular problem as long as it can be used for electric/electronic materials. The epoxy resin is preferably an epoxy resin obtained by epoxidation using a compound having two or more glycidyl groups in the molecule. One or two or more selected from the group consisting of the following can be favorably used: bisphenol A type epoxy resin, bisphenol F type epoxy resin, bisphenol S type epoxy resin, bisphenol AD type epoxy resin, novolak type epoxy resin, cresol novolak type epoxy resin, alicyclic epoxy resin, brominated epoxy resin, phenol novolak type epoxy resin, naphthalene type epoxy resin, brominated bisphenol A type epoxy resin, orthocresol novolac type epoxy resin, rubber modified bisphenol A type epoxy resin, glycidyl amine type epoxy resin, triglycidyl isocyanurate, glycidyl amine compounds such as N,N-diglycidylaniline, glycidyl ester compounds such as tetrahydrophthalic acid diglycidyl ester, phosphorus-containing epoxy resin, biphenyl type epoxy resin, biphenyl Novolak type epoxy resin, trishydroxyphenylmethane type epoxy resin, tetraphenyl ethane epoxy resin. Also, a hydrogenated product or a halogenated product of the abovementioned epoxy resin can be used.

As the phosphorus-containing epoxy resins, an known epoxy resin containing phosphorus known can be used. Further, the phosphorus-containing epoxy resin is, for example, preferably an epoxy resin obtained as a derivative from a 9,10-dihydro-9-oxa-10-phosphaphenanthrene-10-oxide having two or more epoxy groups in the molecule.

The resin layer may include known resins, resin curing agents, compounds, curing promoters, dielectrics (any dielectrics such as dielectrics including inorganic compounds and/or organic compounds, or dielectrics including metal oxides may be used), reaction catalysts, cross-linking agents, polymers, prepregs, skeletal materials and the like. The resin layer may be formed by using known methods and apparatuses for forming resin layers described in prior art.

Resin solutions are prepared by dissolving the abovementioned resins in solvents such as methyl ethyl ketone (MEK), cyclopentanone or the like; these resin solutions are applied to the surface treated copper foil, and/or the ultra-thin copper layer, or the heat resistant layer, the rust preventing layer, the chromate treatment layer, or the silane coupling treatment layer by, for example, a roll coater method, successively heat-dried, if necessary, to remove the solvent to form a B-stage state. For the drying, for example, a hot air drying furnace may be used, and the drying temperature may be 100 to 250° C., and preferably 130 to 200° C.

The copper foil provided with the resin layer (the copper foil with resin layer) and/or the copper foil with carrier (including the copper foil with carrier and resin layer) is used in a mode in which the resin layer is superposed on a substrate, then the whole is thermally compression bonded to thermally cure the resin layer, successively, in the case of a copper foil with carrier, the carrier is peeled to expose the ultra-thin copper layer (naturally, the exposed face is the surface on the intermediate layer side of the ultra-thin copper layer), and a predetermined wiring pattern is formed on the surface treated copper foil or the ultra-thin copper layer.

When the surface treated copper foil with resin layer and/or the copper foil with carrier is used, it is possible to reduce the number of sheets of prepreg material used during the production of a multilayer printed wiring board. Moreover, it is possible to produce a copper clad laminate when the thickness of the resin layer is allowed to be a thickness capable of ensuring interlayer insulation, or even when no prepreg material is used at all. In this case, it is also possible to further improve the smoothness of the surface of the substrate by undercoating an insulating resin on the surface of the substrate.

Besides, when no prepreg material is used, the material cost for the prepreg material can be saved, the laminating step is made simple, thus, it is economically advantageous, the thickness of the produced multilayer printed wiring board is made thinner by the thickness of the prepreg material, and there is an advantage that an ultra-thin multilayer printed wiring board having a thickness of one layer of 100 μm or less can be produced.

The thickness of the resin layer is preferably 0.1 to 80 μm. When the thickness of the resin layer is thinner than 0.1 μm, the adhesive strength decreases, and when the copper foil with resin layer and carrier is laminated on a substrate provided with an inner layer material without interposing a prepreg material, it may become difficult to secure interlayer insulation between the inner layer material and the circuit.

On the other hand, if the thickness of the resin layer is larger than 80 μm, it becomes difficult to form a resin layer having a target thickness by one step of application, which is economically disadvantageous because of extra material cost and man-power. Further, since the formed resin layer is inferior in flexibility, cracks and the like are likely to occur at the time of handling, and excessive resin flowing occurs at the time of thermocompression bonding with the inner layer material, resulting in difficulty in smooth lamination.

Moreover, as another product form of the copper foil with resin and carrier, it is also possible to form a resin layer on the surface treatment layer provided on the ultra-thin copper layer, or on the heat resistant layer, the rust preventive layer, the chromate treatment layer, or the silane coupling treatment layer, and then converting the resin layer into a semi-cured state, and then peeling off the carrier to produce a copper foil with resin in the absence of a carrier.

By mounting electronic components on the printed wiring board, a printed circuit board is completed. In the present disclosure, "printed wiring board" is defined as including such a printed wiring board on which electronic components and the like are mounted, and also a printed circuit board, and a printed substrate.

Further, an electronic device may be manufactured using the printed wiring board, and an electronic device may be manufactured using the printed circuit board on which the electronic components are mounted, and an electronic device may be manufactured using the printed substrate on which the electronic components are mounted. Several examples of manufacturing processes of a printed wiring board using the copper foil with carrier according to the present disclosure are shown below. Further, a printed wiring board can also be similarly manufactured by using the surface treated copper foil according to the present disclosure as the ultra-thin copper layer of the copper foil with carrier.

According to one embodiment, the present disclosure is a method for manufacturing a printed wiring board, comprising a step of preparing the copper foil with carrier according to the present disclosure (Hereinafter, it is also possible to manufacture a printed wiring board by replacing the "copper foil with carrier" and "ultra-thin copper foil" for "surface treated copper foil" or "surface treated copper foil with resin layer". Further, when replacing as above, a printed wiring board may be manufactured assuming that there is no description about the carrier), and an insulating substrate; a step of laminating the copper foil with carrier and the insulating substrate; after laminating the copper foil with carrier and the insulating substrate so that the side of the ultra-thin copper layer faces the insulating substrate, a step of peeling off the carrier of the copper foil with carrier to form a copper clad laminate; and after that, a step of forming a circuit by a semi-additive method, a subtractive method, a partly additive method or a modified semi-additive method using the copper clad laminate. The resin substrate can be a resin substrate incorporating an inner layer circuit.

According to the present disclosure, the semi-additive method refers to a method in which a thin electroless plating is applied on an insulating substrate or a copper foil seed layer, and after the formation of a pattern, a conductor pattern is formed by electroplating and etching.

Therefore, according to one embodiment using the semi-additive method, the present disclosure is a method for manufacturing a printed wiring board, comprising a step of preparing the copper foil with carrier according to the present disclosure, and an insulating substrate;

a step of laminating the copper foil with carrier and the insulating substrate;

after laminating the copper foil with carrier and the insulating substrate, a step of peeling off the carrier of the copper foil with carrier;

a step of completely removing the ultra-thin copper layer, which is exposed by peeling off the carrier, by etching using a corrosive solution such as and acid or by etching with plasma or the like;

a step of providing through-holes or/and blind vias in the resin, which is exposed by removing the ultra-thin copper layer by etching;

a step of performing desmear treatment on the region including the through-holes or/and the blind vias;

a step of providing an electroless plating layer in the region including the resin and the through-holes or/and the blind vias;

a step of providing a plating resist on the electroless plating layer;

a step of exposing the plating resist, and then removing the plating resist in a region where a circuit is to be formed;

a step of providing an electrolytic plating layer on the region where the plating resist is removed and the circuit is to be formed;

a step of removing the plating resist; and a step of removing the electroless plating layer in the region other than the region where the circuit is to be formed by flash etching or the like.

According to another embodiment using the semi-additive method, the present disclosure is a method for manufacturing a printed wiring board, comprising a step of preparing the copper foil with carrier according to the present disclosure, and an insulating substrate;

a step of laminating the copper foil with carrier and the insulating substrate;

after laminating the copper foil with carrier and the insulating substrate, a step of peeling off the carrier of the copper foil with carrier;

a step of providing through-holes and/or blind vias in the ultra-thin copper layer which is exposed by peeling off the carrier and in the insulating resin substrate;

a step of performing desmear treatment on the region including the through-holes or/and the blind vias;

a step of completely removing the ultra-thin copper layer, which is exposed by peeling off the carrier, by etching using a corrosive solution such as and acid or by etching with plasma or the like;

a step of providing an electroless plating layer in the region including the resin which is exposed by removing the ultra-thin copper layer by etching or the like, and the through-holes or/and the blind vias;

a step of providing a plating resist on the electroless plating layer;

a step of exposing the plating resist, and then removing the plating resist in a region where a circuit is to be formed;

a step of providing an electrolytic plating layer on the region where the plating resist is removed and the circuit is to be formed;

a step of removing the plating resist; and a step of removing the electroless plating layer in the region other than the region where the circuit is to be formed by flash etching or the like.

According to another embodiment using the semi-additive method, the present disclosure is a method for manufacturing a printed wiring board, comprising a step of preparing the copper foil with carrier according to the present disclosure, and an insulating substrate;

a step of laminating the copper foil with carrier and the insulating substrate;

after laminating the copper foil with carrier and the insulating substrate, a step of peeling off the carrier of the copper foil with carrier;

a step of providing through-holes and/or blind vias in the ultra-thin copper layer which is exposed by peeling off the carrier and in the insulating resin substrate;

a step of completely removing the ultra-thin copper layer, which is exposed by peeling off the carrier, by etching using a corrosive solution such as and acid or by etching with plasma or the like;

a step of performing desmear treatment on the region including the through-holes or/and the blind vias;

a step of providing an electroless plating layer in the region including the resin which is exposed by removing the ultra-thin copper layer by etching or the like, and the through-holes or/and the blind vias;

a step of providing a plating resist on the electroless plating layer;

a step of exposing the plating resist, and then removing the plating resist in a region where a circuit is to be formed;

a step of providing an electrolytic plating layer on the region where the plating resist is removed and the circuit is to be formed;

a step of removing the plating resist; and a step of removing the electroless plating layer in the region other than the region where the circuit is to be formed by flash etching or the like.

According to another embodiment using the semi-additive method, the present disclosure is a method for manufacturing a printed wiring board, comprising a step of preparing the copper foil with carrier according to the present disclosure, and an insulating substrate;

a step of laminating the copper foil with carrier and the insulating substrate;

after laminating the copper foil with carrier and the insulating substrate, a step of peeling off the carrier of the copper foil with carrier;

a step of completely removing the ultra-thin copper layer, which is exposed by peeling off the carrier, by etching using a corrosive solution such as and acid or by etching with plasma or the like;

a step of providing an electroless plating layer in the region including the resin which is exposed by removing the ultra-thin copper layer by etching or the like, and the through-holes or/and the blind vias;

a step of providing a plating resist on the electroless plating layer;

a step of exposing the plating resist, and then removing the plating resist in a region where a circuit is to be formed;

a step of providing an electrolytic plating layer on the region where the plating resist is removed and the circuit is to be formed;

a step of removing the plating resist; and a step of removing the electroless plating layer in the region other than the region where the circuit is to be formed by flash etching or the like.

According to the present disclosure, the modified semi-additive method refers to a method in which a metal foil is laminated on an insulating layer; the non-circuit-formation portion is protected with a plating resist, and copper is plated up at the circuit forming portion by electrolytic plating; and then, the resist is removed and the metal foil on the portion other than the circuit-formation portion is removed by (flash) etching to form a circuit on the insulating layer.

Therefore, according to one embodiment using the modified semi-additive method, the present disclosure is a method for manufacturing a printed wiring board, comprising a step of preparing the copper foil with carrier according to the present disclosure, and an insulating substrate;

a step of laminating the copper foil with carrier and the insulating substrate;

after laminating the copper foil with carrier and the insulating substrate, a step of peeling off the carrier of the copper foil with carrier;

a step of providing through-holes and/or blind vias in the ultra-thin copper layer which is exposed by peeling off the carrier and in the insulating substrate;

a step of performing desmear treatment on the region including the through-holes or/and the blind vias;

a step of providing an electroless plating layer in the region including the through-holes or/and the blind vias;

a step of providing a plating resist on the surface of the ultra-thin copper layer which is exposed by peeling off the carrier;

after providing the plating resist, a step of forming a circuit by electrolytic plating;

a step of removing the plating resist; and a step of removing, by flash etching, the ultra-thin copper layer which is exposed by removing the plating resist.

According to another embodiment using the modified semi-additive method, the present disclosure is a method for manufacturing a printed wiring board, comprising a step of preparing the copper foil with carrier according to the present disclosure, and an insulating substrate;

a step of laminating the copper foil with carrier and the insulating substrate;

after laminating the copper foil with carrier and the insulating substrate, a step of peeling off the carrier of the copper foil with carrier;

a step of providing a plating resist on the surface of the ultra-thin copper layer which is exposed by peeling off the carrier;

a step of exposing the plating resist, and then removing the plating resist in a region where a circuit is to be formed;

a step of providing an electrolytic plating layer on the region where the plating resist is removed and the circuit is to be formed;

a step of removing the plating resist; and a step of removing the electroless plating layer in the region other than the region where the circuit is to be formed by flash etching or the like.

According to the present disclosure, the partly additive method refers to a method in which catalyst nuclei are imparted on a substrate including a conductor layer, or, if necessary, on a substrate including pierced holes for through-holes or via holes, and the substrate is etched to form a conductor circuit; and, if necessary, after a solder resist or a plating resist is provided, plating up is applied to the through-holes, via holes or the like on the conductor circuit by electroless plating treatment to manufacture a printed wiring board.

Therefore, according to one embodiment using the partly additive method, the present disclosure is a method for manufacturing a printed wiring board, comprising a step of preparing the copper foil with carrier according to the present disclosure, and an insulating substrate;

a step of laminating the copper foil with carrier and the insulating substrate;

after laminating the copper foil with carrier and the insulating substrate, a step of peeling off the carrier of the copper foil with carrier;

a step of providing through-holes and/or blind vias in the ultra-thin copper layer which is exposed by peeling off the carrier and in the insulating substrate;

a step of performing desmear treatment on the region including the through-holes or/and the blind vias;

a step of imparting catalyst nuclei to the region including the through-holes or/and the blind vias;

a step of providing an etching resist on the surface of the ultra-thin copper layer which is exposed by peeling the carrier;

a step of forming a circuit pattern by exposing the etching resist;

a step of forming a circuit by removing the ultra-thin copper layer and the catalyst nuclei by a method such as etching with a corrosive solution such as an acid or by etching with plasma;

a step of removing the etching resist;

a step of providing a solder resist or a plating resist on the surface of the insulating resin substrate exposed by removing the ultra-thin copper layer and the catalyst nuclei by a method such as etching with a corrosive solution such as an acid or etching with plasma; and a step of providing an electroless plating layer in the region where neither the solder resist nor the plating resist is provided.

According to the present disclosure, the subtractive method refers to a method in which the unnecessary portion of the copper foil on the copper clad laminate is selectively removed by etching or the like to form a conductor pattern.

Therefore, according to one embodiment using the subtractive method, the present disclosure is a method for manufacturing a printed wiring board, comprising a step of preparing the copper foil with carrier according to the present disclosure, and an insulating substrate;

a step of laminating the copper foil with carrier and the insulating substrate;

after laminating the copper foil with carrier and the insulating substrate, a step of peeling off the carrier of the copper foil with carrier;

a step of providing through-holes and/or blind vias in the ultra-thin copper layer which is exposed by peeling off the carrier and in the insulating substrate;

a step of performing desmear treatment on the region including the through-holes or/and the blind vias;

a step of providing an electroless plating layer in the region including the resin and the through-holes or/and the blind vias;

a step of providing an electrolytic plating layer on the surface of the electroless plating layer;

a step of providing an etching resist on the surface of the electrolytic plating layer or/and on the surface of the ultra-thin copper layer;

a step of forming a circuit pattern by exposing the etching resist;

a step of forming a circuit by removing the ultra-thin copper layer and the electroless plating layer and the electrolytic plating layer, by a method such as etching with a corrosive solution such as an acid or etching with plasma; and a step of removing the etching resist.

According to another embodiment using the subtractive method, the present disclosure is a method for manufacturing a printed wiring board, comprising a step of preparing the copper foil with carrier according to the present disclosure, and an insulating substrate;

a step of laminating the copper foil with carrier and the insulating substrate;

after laminating the copper foil with carrier and the insulating substrate, a step of peeling off the carrier of the copper foil with carrier;

a step of providing through-holes and/or blind vias in the ultra-thin copper layer which is exposed by peeling off the carrier and in the insulating substrate;

a step of performing desmear treatment on the region including the through-holes or/and the blind vias;

a step of providing an electroless plating layer in the region including the resin and the through-holes or/and the blind vias;

a step of forming a mask on the surface of the electroless plating layer;

a step of providing an electrolytic plating layer on the surface of the electroless plating layer where no mask is formed thereon;

a step of providing an etching resist on the surface of the electrolytic plating layer or/and on the surface of the ultra-thin copper layer;

a step of forming a circuit pattern by exposing the etching resist;

a step of forming a circuit by removing the ultra-thin copper layer and the electroless plating layer, by a method such as etching with a corrosive solution such as an acid or etching with plasma; and a step of removing the etching resist.

The step of providing through-holes or/and blind vias, and the subsequent desmear step may be omitted.

Here, a specific embodiment of the method for producing a printed wiring board, using the copper foil with carrier according to the present disclosure is described in detail. Note that here the case where a primary particle layer and a secondary particle layer are provided as roughening treatment layers has been described First, as shown is FIG. 1-A, a copper foil with carrier (a first layer) having an ultra-thin copper layer with a roughening treatment layer on the surface of the copper foil is prepared.

Next, as shown is FIG. 1-B, a resist is applied on the roughening treatment layer of the ultra-thin copper layer, and exposure and development are performed to etch the resist into a predetermined shape.

Next, as shown in FIG. 1-C, after forming a plating for a circuit, the resist is removed, and thus a circuit plating having a predetermined shape is formed.

Figure 2:
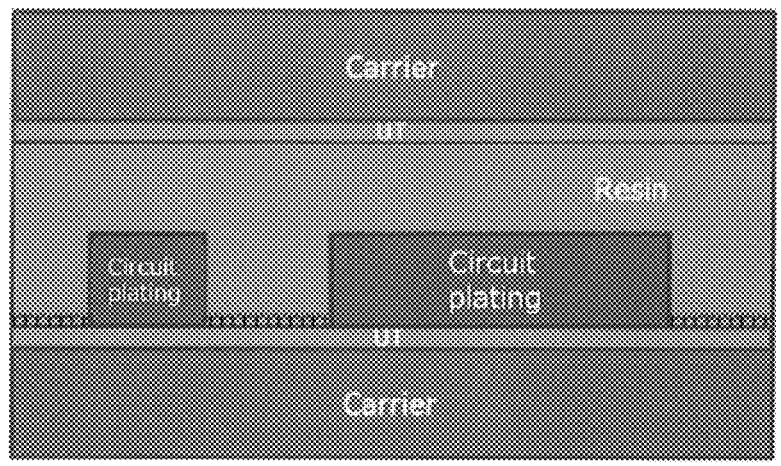
FIG. 2 D to F are schematic views of the cross section of the wiring board in the process from laminating a resin and a second copper foil with carrier to laser drilling, according to one embodiment of the method for manufacturing a printed wiring board using the copper foil with carrier according to the present disclosure.
Figure 2:
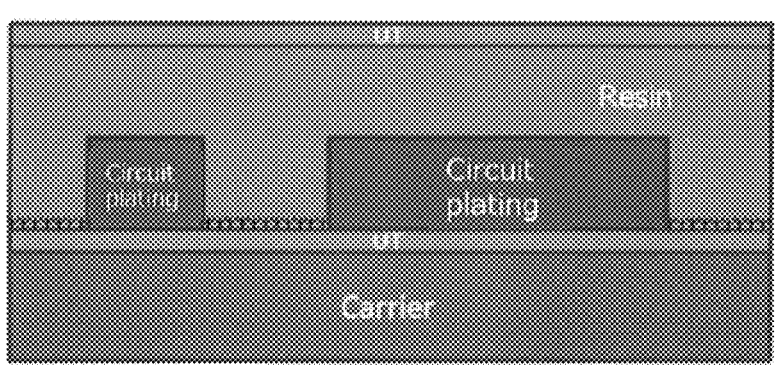
Figure 2:
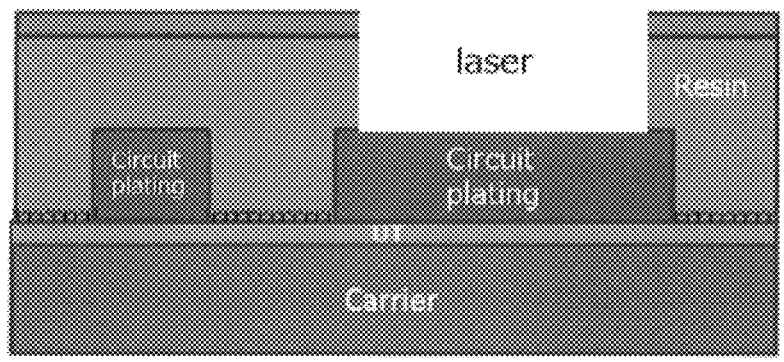

Next, as shown in FIG. 2-D, a resin layer is laminated on the ultra-thin copper layer by providing embedding resin so that the circuit plating is covered (so that the circuit plating is embedded), and then another copper foil with carrier (a second layer) is bonded from the ultra-thin copper layer side.

Next, as shown in FIG. 2-E, the carrier is peeled off from the copper foil with carrier (from the second layer).

Next, as shown in FIG. 2-F, laser drilling is performed at predetermined positions of the resin layer, or the copper foil and the resin layer, and thus the circuit plating is exposed to form a blind via.

Figure 3:
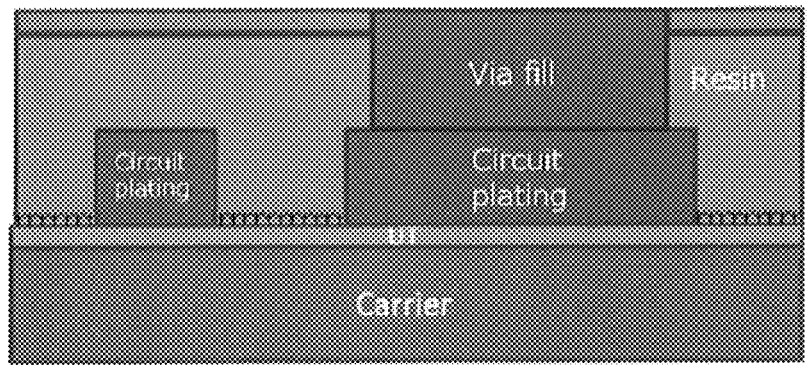
FIG. 3 G to I are schematic views of the cross section of the wiring board in the process from formation of a via fill to peeling off the carrier of the first layer, according to one embodiment of the method for manufacturing a printed wiring board using the copper foil with carrier according to the present disclosure.
Figure 3:
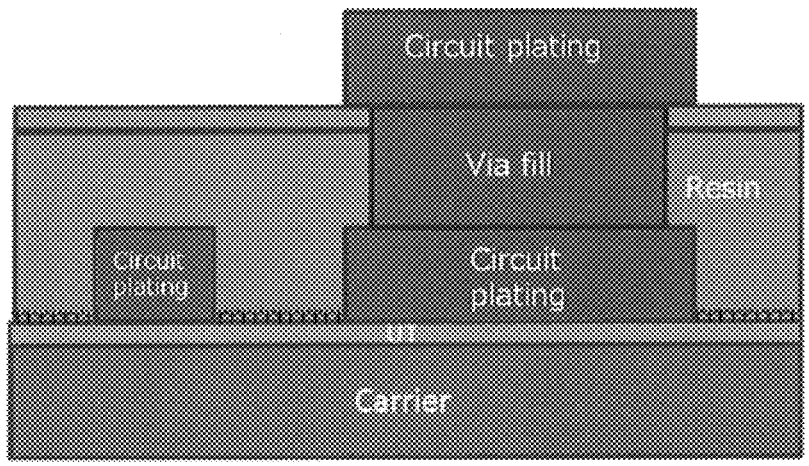
Figure 3:
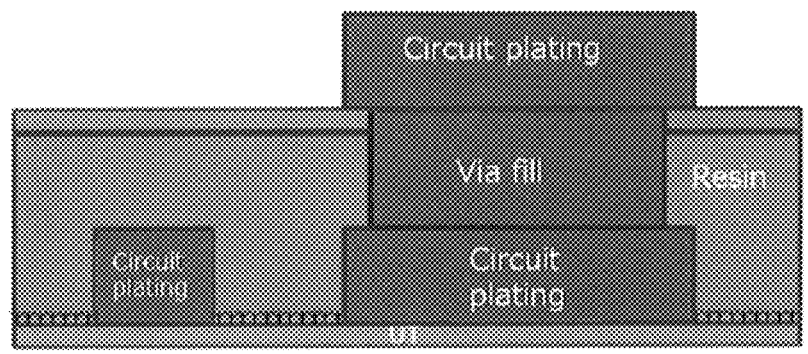

Next, as shown in FIG. 3-G, copper is implanted into the blind via to form a via fill.

Next, as shown in FIG. 3-H, a circuit plating is formed in the same manner as shown in above-described FIG. 1-B and FIG. 1-C.

Next, as shown in FIG. 3-I, the carrier is peeled off from the copper foil with carrier (from the first layer).

Figure 4:
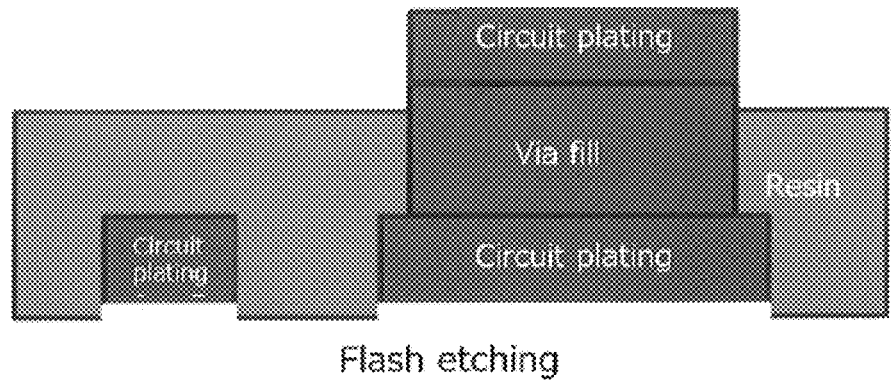
FIG. 4 J to K are schematic views of the cross section of the wiring board in the process from flash etching to formation of a bump and a copper pillar, according to one embodiment of the method for manufacturing a printed wiring board using the copper foil with carrier according to the present disclosure.
Figure 4:
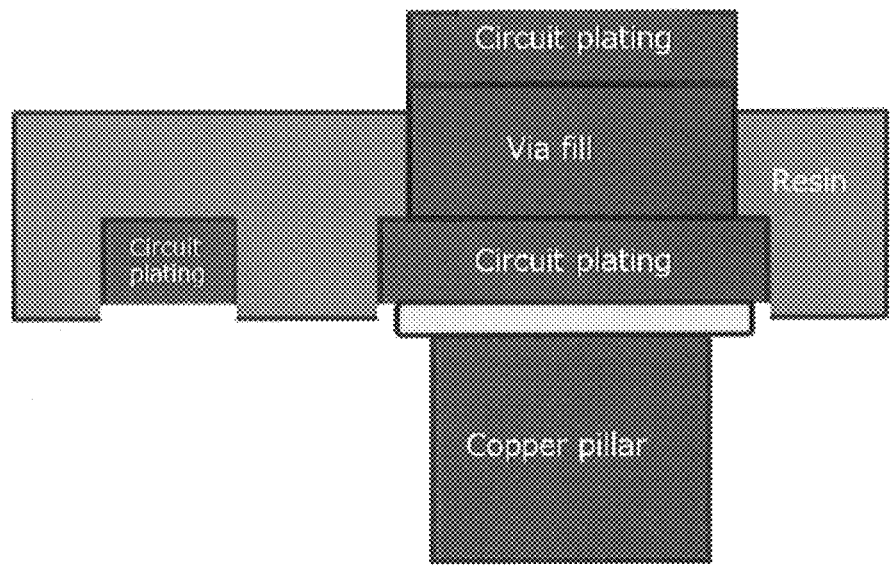

Next, as shown in FIG. 4-J, by flash etching, the ultra-thin copper layers on both surfaces are removed, to expose the surface of the circuit plating in the resin layer.

Next, as shown in FIG. 4-K, a bump is formed on the circuit plating in the resin layer, and a copper pillar is formed on the solder concerned. In this way, a printed wiring board using the copper foil with carrier according to the present disclosure can be manufactured.

Further, in the above-described method of manufacturing a printed wiring board, it is also possible to read "ultra-thin copper layer" as a carrier and "carrier" as an ultra-thin copper layer, and in this case, it is also possible to form a circuit on the carrier-side surface of the copper foil with carrier and embed the circuit with a resin to manufacture a printed wiring board As the "another copper foil with carrier" (the second layer), the copper foil with carrier according to the present disclosure may be used, or a conventional copper foil with carrier may also be used, and moreover, an ordinary copper foil may also be used. In addition, on the circuit on the second layer as shown in FIG. 3-H, a layer of a circuit or a plurality of layers of circuit may be formed, and the formation of these circuits may also be performed by a semi-additive method, a subtractive method, a partly additive method or a modified semi-additive method.

According to such a method for producing a printed wiring board as described above, because of the constitution allowing the circuit plating to be embedded in the resin layer, during removing the ultra-thin copper layer by flash etching, for example, as shown in FIG. 4-J, the circuit plating is protected by the resin layer, and the shape of the circuit plating is maintained, and accordingly the formation of a fine circuit is facilitated. In addition, because the circuit plating is protected by the resin layer, the migration resistance is improved and the conduction of the circuit wiring is suppressed satisfactorily. Accordingly, the formation of a fine circuit is facilitated. As shown in FIG. 4-J and FIG. 4-K, when the ultra-thin copper layer is removed by flash etching, the exposed surface of the circuit plating has a shape recessed from the resin layer, and hence the formation of a bump on the circuit plating concerned, and moreover the formation of a copper pillar thereon are facilitated to improve the production efficiency.

As the embedding resin, known resins and prepregs can be used. For example, BT (bismaleimide triazine) resin, a prepreg being a glass cloth impregnated with BT resin, and the ABF film and ABF manufactured by Ajinomoto Fine-Techno Co., Ltd. can be used. As the embedding resin, the resin layer and/or the resin and/or the prepreg described in the present description can also be used.

The copper foil with carrier used as the first layer may have a substrate or a resin layer on the surface of the copper foil with carrier. By having the substrate or the resin layer, the copper foil with carrier used as the first layer is supported and hardly undergoes wrinkles so that there is an advantage that the productivity is improved. As the substrate or the resin layer, any substrate or resin layer can be used as long as it can support the copper foil with carrier used as the first layer. For example, as the substrate or the resin layer, the carrier(s), the prepreg(s) and the resin layer(s) described in the present specifications, and known carrier(s), prepreg(s), resin layer(s), metal plate(s), metal foil(s), plate(s) of inorganic compound(s), foil(s) of inorganic compound(s), plate(s) of organic compound(s) and foil(s) of organic compound(s) can be used.

According to another embodiment, the present disclosure is a method for manufacturing a printed wiring board, comprising a step of laminating the ultrathin copper layer side surface or the carrier side surface of the copper foil with carrier according to the present disclosure, and a resin substrate; a step of forming, at least once, two layers consisting of a resin layer and a circuit, on the surface of the side of the ultra-thin copper layer which is laminated with the resin substrate, or on the surface of the copper foil with carrier which is on the side opposite to the carrier side surface; and after forming the two layers consisting of the resin layer and the circuit, a step of peeling off the carrier or the ultra-thin copper layer from the copper foil with carrier (a coreless method).

As a specific example of the coreless method, first, the ultrathin copper layer side surface or the carrier side surface of the copper foil with carrier according to one embodiment of the present invention is laminated with a resin substrate to form a laminate (also referred to as a copper clad laminate). Thereafter, a resin layer is formed on the surface of the ultra-thin copper layer laminated with the resin substrate or on the surface of the copper foil which is on the side opposite to the carrier side surface. As to the resin layer formed on the carrier side surface or on the ultra-thin copper layer side surface, another copper foil with carrier may be further laminated from the carrier side or the ultrathin copper layer side thereof.

Further, the above-described method for manufacturing a printed wiring board can also be applied to a laminate comprising, a resin substrate or a resin or a prepreg as a center, and two copper foils with carrier laminated on the surface of both sides of the resin substrate or the resin or the prepreg, the copper foils with carrier being laminated in the order of carrier/intermediate layer/ultra-thin copper layer or in the order of ultra-thin copper foil/intermediate layer/carrier, or can be applied to a laminate comprising, a resin substrate or a resin or a prepreg as a center, and layers laminated on the surface of both sides of the resin substrate or the resin or the prepreg, the layers being laminated in the order of "carrier/intermediate layer/ultrathin copper layer/resin substrate or resin or prepreg/carrier/intermediate layer/ultra-thin copper layer", or can be applied to a laminate comprising, a resin substrate or a resin or a prepreg as a center, and layers laminated on the surface of both sides of the resin substrate or the resin or the prepreg, the layers being laminated in the order of "carrier/intermediate layer/ultrathin copper layer/resin substrate/carrier/intermediate layer/ultra-thin copper layer", or can be applied to a laminate comprising, a resin substrate or a resin or a prepreg as a center, and layers laminated on the surface of both sides of the resin substrate or the resin or the prepreg, the layers being laminated in the order of "ultra-thin copper layer/intermediate layer/carrier/resin substrate/carrier/intermediate layer/ultra-thin copper layer". Furthermore, it is possible to form another resin layer on the exposed surfaces of the ultra-thin copper layer(s) or the carrier(s), which are at the two ends of the laminate, and then form a copper layer or a metal layer, and then form a circuit by processing the copper layer or the metal layer. Furthermore, Further, another resin layer may be provided on the circuit so as to embed the circuit. Further, such circuit and resin layer may be formed one or more times (a build-up method). With respect to the thus formed laminate (hereinafter also referred to as laminate B), the ultra-thin copper layer or the carrier of each copper foil with carrier can be peeled off from the carrier or the ultra-thin copper layer to manufacture a coreless substrate.

Further, to prepare the above-described coreless substrate, it is possible to use a laminate as a center, the laminate, which is to be described layer, being prepared using two copper foils with carrier, having a constitution of ultra-thin copper layer/intermediate layer/carrier/carrier/intermediate layer/ultra-thin copper layer, or a constitution of carrier/intermediate layer/ultra-thin copper layer/ultra-thin copper layer/intermediate layer/carrier, or a constitution of carrier/intermediate layer/ultra-thin copper layer/carrier/intermediate layer/ultra-thin copper layer. With respect to the thus formed laminate (hereinafter also referred to as laminate A), it is possible to form, at least once, two layers consisting of a resin layer and a circuit, on the surfaces of the ultra-thin copper layer or the carrier on both sides of the laminate, and after forming, at least once, the two layers consisting of a resin layer and a circuit, by peeling off the ultra-thin copper layer or the carrier of the copper foil with carrier from the carrier or the ultra-thin copper layer, it is possible to manufacture a coreless substrate.

As to the above-mentioned laminate, other layers can be applied to the surface of the ultra-thin copper layer, to the surface of the carrier, between the carriers, between the ultra-thin copper layers, between the ultra-thin copper layer and the carrier Layer. The other layer may be a resin substrate or a resin layer.

In this specification, when the ultra-thin copper layer or the carrier or the laminate have other layers on the surface of the ultra-thin copper layer or the carrier or the laminate, the terms "surface of the ultra-thin copper layer", "surface of the side of the ultra-thin copper layer", "surface of the ultra-thin copper layer side", "ultrathin copper layer surface", "surface of the carrier", "surface of the side of the carrier", "surface of the carrier side", "carrier surface", "the surface of the laminate" and "the laminate surface" refer to the surface of the other layers (the outermost surface).

Further, it is preferable that the laminate has a structure of an ultra-thin copper layer/intermediate layer/carrier/carrier/intermediate layer/ultra-thin copper layer. This is because, when a coreless substrate is manufactured using the laminate, an ultra-thin copper layer is disposed on the coreless substrate side, so that it becomes easier to form a circuit on the coreless substrate using modified semi-additive method. This is also because, since the ultra-thin copper layer is thin, it is easy to remove the ultra-thin copper layer, and to form a circuit on the coreless substrate by using the semi-additive method after removal of the ultrathin copper layer.

Further, in the present specification, the "laminate", which is not specifically described as "laminate A" or "laminate B", refers to a laminate including at least laminate A and laminate B.

In the method of manufacturing a coreless substrate described above, by covering a part or the whole of the end face of the copper foil with carrier or the laminate (including the laminate A) with a resin, when manufacturing a printed wiring board using the build-up method, it is possible to prevent the chemical solution from penetrating into between one copper foil with carrier and another copper foil with carrier and It is possible to prevent separation of the ultra-thin copper layer and the carrier, and prevent corrosion of the copper foil with carrier caused by the penetration of chemical solution, and eventually improving the yield. As the "resin covering part or the whole of the end face of the copper foil with carrier" or "the resin covering a part or the whole of the end face of the laminate" used herein, a resin or a known resin which can be used as a resin layer can be used. Further, in the method of manufacturing a coreless substrate described above, when viewed from above the copper foil with carrier or the laminate in a plan view, at least part of the periphery of the laminated portion of the copper foil with carrier or the laminate (the laminated portion of the carrier and the ultra-thin copper layer, or the laminated portion of the carrier with copper foil and another copper foil with carrier) may be covered with a resin or a prepreg. Further, the laminate (laminate A) formed by the method for manufacturing a coreless substrate described above may be constituted by bringing a pair of copper foils with carrier into contact with each other in a separable manner. Further, when viewed from above the copper foil with carrier or the laminate in a plan view, the entire periphery or the entire surface of the laminated portion of the copper foil with carrier or the laminate (the laminated portion of the carrier and the ultra-thin copper layer, or the laminated portion of the carrier with copper foil and another copper foil with carrier) may be covered with a resin or a prepreg. Further, in a plan view, it is preferable that the resin or prepreg is larger than the copper foil with carrier, or larger than the laminate, or larger than the laminated portion of the laminate. It is preferable that the resin or the prepreg is laminated on both sides of the copper foil with carrier or the laminate, and the copper foil with carrier or the laminate having a structure in which the copper foil with carrier or the laminate is packed (wrapped) by the resin or the prepreg. With such a configuration, when the copper foil with carrier or the laminate is viewed in a plan view, the laminated portion of the copper foil with carrier or the laminate is covered with the resin or the prepreg, and the members are blocked in the side direction, that is, from the lateral direction with respect to the stacking direction, and as a result, it is possible to reduce peeling between the carrier and the ultra-thin copper layer or between copper foils with carrier during handling. In addition, by covering the periphery of the laminated portion of the copper foil with carrier or the laminate with a resin or a prepreg so as not to expose the periphery thereof, it is possible to prevent the chemical solution from entering the interface of the laminated portion during the chemical solution treatment step as described above, and corrosion and erosion of the copper foil with carrier can be prevented. When one copper foil with carrier is separated from a pair of copper foils with carrier of the laminate, or when the carrier and the copper foil (the ultra-thin copper layer) of the copper foil with carrier are separated, if the laminated portion of the copper foil or the laminate (the laminated portion of the carrier and the carrier, or the laminated portion of one copper foil with carrier and another copper foil with carrier), which is covered with the resin or the prepreg, is firmed adhered by the resin or the prepreg or the like, it may be necessary to remove the laminated portion etc. by cutting or the like.

From the carrier side or the ultra-thin copper layer side of one copper foil with carrier according to the present disclosure, another copper foil with carrier according to the present disclosure may be laminated on its carrier side or its ultra-thin copper layer side. Also, a laminate may be obtained by directly laminate the carrier side or the ultra-thin copper layer side of the above-described "one copper foil with carrier" and the carrier side or the ultra-thin copper layer of the above-described "another copper foil with carrier", with an adhesive interposed between them, if necessary. In addition, the carrier or the ultra-thin copper layer of the "one copper foil with carrier" may be bonded to the carrier or the ultra-thin copper layer of the "another copper foil may with carrier". Here, the term "bonded" also includes a case where, the carrier or the ultra-thin copper layer has a surface treatment layer, and they are bonded to each other with the surface treatment layer interposed between them. In addition, a part or the whole of the end face of the laminate may be covered with a resin.

Lamination of carriers, ultra-thin copper layers, a carrier and an ultra-thin copper layer, or copper foils with carrier, can be performed simply by superimposing, or for example, by the following method.

(a) Metallurgical bonding method: welding (arc welding, TIG (Tungsten Inert Gas) welding, MIG (Metal Inert Gas) welding, resistance welding, seam welding, spot welding), pressure welding (ultrasonic welding, Friction stir welding), brazing;

(b) Mechanical bonding method: caulking, rivet bonding (bonding with self piercing rivet, bonding with rivet), stitcher;

(c) Physical bonding method: Adhesive, (double-sided) adhesive tape

By using the abovementioned bonding methods to bond a part or the whole of one carrier to a part or the whole of another carrier or to apart or the whole of a ultra-thin copper layer, It is possible to manufacture a laminate, wherein the "one carrier" is laminated with the "another carrier" or with the ultra-thin copper layer, and the carriers or the carrier and the ultra-thin copper layer are bonded in a separable manner. In the case where one carrier and the other carrier or the ultra-thin copper layer are weakly bonded and one carrier and the other carrier or the ultra-thin copper layer are laminated, one carrier can be separated from the other carrier or the ultra-thin copper layer even if the joint of the one carrier and the other carrier or the ultra-thin copper layer is not removed. On the other hand, in the case where one carrier and the other carrier or the ultra-thin copper layer are strongly bonded, by cutting or chemically polishing (etching or the like) the joint of the one carrier and the other carrier or the ultra-thin copper layer, it is possible to separate one carrier from the other carrier or the ultra-thin copper layer.

In addition, via a step of forming, at least once, two layers consisting of a resin layer and a circuit, on the laminated described above, and after forming, at least once, the two layers consisting of a resin layer and a circuit, a step of peeling off the ultra-thin copper foil or carrier from the copper foil with carrier of the laminate, a printed wiring board without a core can be manufactured. Further, the two layers of a resin layer and a circuit may be provided on one or both surfaces of the laminate.

The resin substrate, the resin layer, the resin, and the prepreg used in the above-described laminate may be the resin layer described in this specification, and may include resin, resin curing agent, compounds, curing accelerators, dielectrics, reaction catalysts, crosslinking agents, polymers, prepregs, skeleton members, and the like, which can be used in the resin layer described in this specification. Further, the abovementioned copper foil with carrier or the laminate may be smaller than the resin or prepreg or resin substrate or resin layer in a plan view.

In addition, the resin substrate is not particularly limited as long as it has properties applicable to printed wiring boards and the like, but for example, for a rigid PWB, paper base phenolic resin, paper base epoxy resin, synthetic fiber cloth base epoxy resin, glass cloth/paper composite base epoxy resin, glass cloth/glass nonwoven fabric composite base epoxy resin and glass cloth base epoxy resin etc. may be used, and for an FPC, polyester film, polyimide film, LCP (Liquid Crystal Polymer) film, fluororesin, etc. can be used. When an LCP (Liquid Crystal Polymer) film or a fluororesin film is used, the peel strength between the film and the surface treated copper foil tends to be smaller than when a polyimide film is used. Therefore, in the case where an LCP (Liquid Crystal Polymer) film or a fluororesin film is used, after forming a circuit, by covering the copper circuit with a coverlay, peeling of the film from the copper circuit, which is caused by the decrease of the peeling strength, can be prevented.

EXAMPLES

Hereinafter, description will be given based on Examples and Comparative examples. It should be noted all the examples are merely exemplary, and the present invention is not limited to the examples. That is, the present invention includes other embodiments and modifications.

For the raw foils of Examples 1 to 2, 4 to 6, 9 to 16 and Comparative Examples 1 to 2, 4 and 6 to 7, a standard rolled copper foil TPC having a thickness of 12 μm (tough pitch copper in accordance with JIS H 3100 C 1100, made by JX Nippon Mining & Metals Corporation, ten point average surface roughness Rz=0.7 μm) was used. For the raw foils of Examples 3 and 8 and Comparative Examples 3 and 5, an electrolytic copper foil having a thickness of 12 μm (HLP foil made by JX Nippon Mining & Metals Corporation, ten point average roughness Rz=0.7 μm on the surface of the deposition surface (M surface)) was used, and a surface treatment layer was provided on the deposition surface (M surface).

For the raw foils of Example 7 and Comparative Example 8, copper foils with a carrier manufactured by the following method were used.

For Example 7, an electrolytic copper foil having a thickness of 18 μm (JTC foil made by JX Nippon Mining & Metals Corporation) was prepared as a carrier, and for Comparative Example 8, a standard rolled copper foil TPC having a thickness of 18 μm as described above was prepared as a carrier. Then, under the following conditions, an intermediate layer was formed on the surface of the carrier, and an ultra-thin copper layer was formed on the surface of the intermediate layer. When the carrier was electrolytic copper foil, an intermediate layer was formed on the glossy surface (S surface).

Example 7, Comparative Example 8

<Intermediate Layer>
(1) Ni Layer (Ni Plating)
The carrier was electroplated with a roll-to-roll type continuous plating line under the following conditions to form a Ni layer having a deposition amount of 1000 μg/dm². Specific plating conditions are described below.
Nickel sulfate: 270 to 280 g/L
Nickel chloride: 35 to 45 g/L
Nickel acetate: 10 to 20 g/L
Boric acid: 30 to 40 g/L
Gloss agent: saccharin, butynediol, etc.
Sodium dodecyl sulfate: 55 to 75 ppm
pH: 4 to 6
Bath temperature: 55 to 65° C.
Current density: 10 A/dm²
(2) Cr Layer (Electrolytic Chromate Treatment)
Next, after rinsing (with water) and pickling (with acid) the surface of the Ni layer formed in (1), a Cr layer having a deposition amount of 11 μg/dm² was deposited on the Ni layer with a roll-to-roll type continuous plating line by electrolytic chromate treatment under the following conditions.
Potassium dichromate: 1 to 10 g/L, Zinc: 0 g/L
pH: 7 to 10
Liquid temperature: 40 to 60° C.
Current density: 2 A/dm²
<Ultrathin Copper Layer>
Next, after rinsing (with water) and pickling (with acid) the surface of the Cr layer formed in (2), an ultrathin copper layer having a thickness of 3 μm was successively formed on the Cr layer with a roll-to-roll type continuous plating line by electroplating under the following conditions, and an ultra-thin copper foil with carrier is manufactured.
Copper concentration: 90 to 110 g/L
Sulfuric acid concentration: 90 to 110 g/L
Chloride ion concentration: 50 to 90 ppm
Leveling agent 1 (bis(3-sulfopropyl)disulfide): 10 to 30 ppm
Leveling agent 2 (amine compound): 10 to 30 ppm
The following amine compound was used as the leveling agent 2.

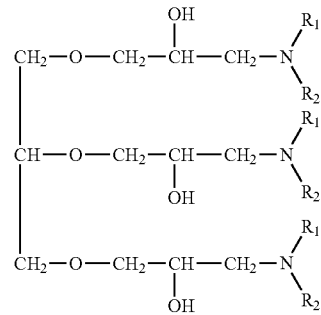

[Chemical formula 2]

(in the chemical formula, $R^1$ and $R^2$ are respectively a group selected from the group consisting of a hydroxyalkyl group, an ether group, an aryl group, an aromatic substituted alkyl group, an unsaturated hydrocarbon group, and an alkyl group.)

Electrolyte temperature: 50 to 80° C.
Current density: 100 A/dm$^2$
Electrolytic solution linear velocity: 1.5 to 5 m/sec Subsequently, under the conditions shown in Tables 1 to 3, a primary particle layer, or a primary particle layer and a secondary particle layer were formed on the surface of the rolled copper foil, the electrolytic copper foil or the ultra-thin copper layer of the copper foil with carrier. In the examples in which two current conditions or two coulomb quantities are described in the primary particle current condition column of Table 1, it means that a plating was carried out under the conditions described on the left and further another plating was carried out under the conditions described on the right. For example, in Example 1, "(50 A/dm$^2$, 65 As/dm$^2$)+(8 A/dm$^2$, 16 As/dm$^2$)" is written in the primary particle current condition column, and it means that a plating was carried out for forming primary particles under a current density of 50 A/dm$^2$ and a coulomb amount of 65 As/dm$^2$, and then another plating was carried out for forming primary particles under a current density of 8 A/dm$^2$ and a coulomb amount of 16 As/dm$^2$.

Subsequently, on the primary particle layer, or in the cases where a secondary particle layer was formed, on the secondary particle layer, a cover plating was formed under the conditions shown in Tables 1 and 4. In addition, when it is stated that a plurality of treatments had been performed in the cover plating conditions column, it means that the treatment are performed in order from the treatment on the left side. For example, in Table 1, Example 2, "(2) Ni—Mo+ (1) Zn—Cr" is described in the column of "cover plating conditions (cover plating solution in Table 4)", and (2) 0.17, (1) 1.0" is described in the column of "cover plating energization time (seconds)". This means that in Example 2, cover plating was carried out in the order of (2) Ni—Mo plating and (1) Zn—Cr plating, which are described in Table 4, and the energizing time was 0.17 seconds for (2) Ni—Mo plating and 1.0 second for (1) Zn—Cr plating, respectively.

<Surface Treatment Layer Other than Primary Particle Layer, Secondary Particle Layer and Cover Plating>

After forming the cover plating, the following electrolytic chromate treatment was performed for Examples 3 and 5 and Comparative Example 6. For the other Examples and Comparative Examples, the following electrolytic chromate treatment was not performed.

Electrolytic Chromate Treatment
Liquid composition: potassium dichromate 1 to 1 g/L
Liquid temperature: 40 to 60° C.
pH: 0.5 to 10
Current density: 0.01 to 2.6 A/dm$^2$
Energization time: 0.05 to 30 seconds Thereafter, silane coupling treatment using the following diaminosilane was performed for Example 3 to 5 and 10.

Silane Coupling Treatment
Silane coupling agent: N-2-(aminoethyl)-3-aminopropyl-trimethoxysilane
Silane coupling agent concentration: 0.5 to 1.5 vol %
Treating temperature: 20 to 70° C.
Treating time: 0.5 to 5 seconds (Measurement of Ten Point Mean Roughness Rz)

Surface roughness Rz (ten point average roughness) of the surface of the roughening treatment layer side was measured according to JIS B 0601-1982, using a contact roughness meter Surfcorder SE-3C stylus roughness meter manufactured by Kosaka Laboratory Co., Ltd. The Rz was arbitrarily measured at 10 points, and the average value of the Rz of the 10 points was taken as the value of Rz.

(Measurement of Transmission Loss)

For each sample, a liquid crystal polymer resin (Vecstar CTZ, thickness 50 μm, made by KURARAY CO., LTD., resin which is a copolymer of hydroxybenzoic acid (ester) and hydroxynaphthoic acid (ester)) was bonded, and a microstrip line was formed by etching so as to have a characteristic impedance of 50Ω, and transmission coefficient was measured using a network analyzer N5247A manufactured by HP Co., Ltd. to determine the transmission loss at a frequency of 20 GHz. For evaluating the transmission loss at a frequency of 20 GHz, "○ (a circle)" was defined as 4.0 dB/10 cm or less, and "X (a X-mark)" was defined as 4.1 dB/10 cm or more.

(Measurement of Peel Strength)

The surface treated surface of the copper foil and the resin substrate shown in Table 2 were laminated with a hot press to prepare a copper clad laminate, and a copper wiring (a circuit) with a width of 10 mm was prepared using a general copper chloride circuit etching solution. The foil was peeled off from the substrate and the initial peel strength was measured while peeling it in the direction of 90°. Also, the fabricated circuit was placed in an oven at 180° C. under the atmosphere, and was taken out after 10 days, and the peel strength after heating was measured while pulling in the direction of 90°, which was the same with the normal peeling. Evaluation of peel strength was rated as "○ (a circle)" when the initial peel strength was 0.5 kg/cm or more, and peel strength after heating was 0.3 kg/cm or more, and was rated as "X(X-mark)" when the initial peel strength was less than 0.5 kg/cm or peeling after heating was less than 0.3 kg/cm.

With respect to the laminated resin described in Table 2, "LCP" is a liquid crystal polymer, "low dielectric PI" is low dielectric polyimide, and "PTFE" is polytetrafluoroethylene.

For the liquid crystal polymer, Vecstor CT-Z manufactured by Kuraray Co., Ltd., which is a copolymer of hydroxybenzoic acid (ester) and hydroxynaphthoic acid (ester), was used.

For the low dielectric polyimide, polyimide having a dielectric loss tangent of 0.002 was used. In the present specifications, a polyimide having a dielectric loss tangent value of 0.01 or less is defined as a low dielectric polyimide. The dielectric loss tangent can be measured by the triplate resonator method described in JPCA-TM001-2007 described in "Test methods of copper-clad laminate for printed wiring board, relative dielectric constant and dielectric loss tangent", by general incorporated association: Japan Electronics Circuit Association.

Further, the conditions for the hot press of the copper foil and the resin substrate were as follows.

In the case of using liquid crystal polymer as the resin substrate: pressure 3.5 MPa, heating temperature: 300° C., heating time: 10 minutes In the case of using low dielectric polyimide as the resin substrate: pressure 4 MPa, heating temperature 360° C., heating time 5 minutes In the case of using polytetrafluoroethylene as the resin substrate: pressure 5 MPa, heating temperature 350° C., heating time 30 min The thickness of the above-mentioned resin substrate material was 50 μm.

The above manufacturing conditions and evaluation results are shown in Tables 1 to 4.

TABLE 1

|  | | primary particle current condition (primary particle plating solution (I) + (II) in Table 3) | secondary particle current condition (secondary particle plating solution in Table 3) | cover plating conditions (cover plating solution in Table 4) | cover plating energization time (seconds) |
|---|---|---|---|---|---|
| Example 1 | rolled copper foil | (50 A/dm$^2$, 65 As/dm$^2$) + (8 A/dm$^2$, 16 As/dm$^2$) | (30 A/dm$^2$, 18 As/dm$^2$) | (1) Zn—Cr | 2.0 |
| Example 2 | rolled copper foil | (50 A/dm$^2$, 60 As/dm$^2$) + (8 A/dm$^2$, 14 As/dm$^2$) | (30 A/dm$^2$, 17 As/dm$^2$) | (2) Ni—Mo + (1) Zn—Cr | (2) 0.17, (1) 1.0 |
| Example 3 | electrolytic copper foil | (55 A/dm$^2$, 75 As/dm$^2$) + (10 A/dm$^2$, 22 As/dm$^2$) | (35 A/dm$^2$, 33 As/dm$^2$) | (3) Zn | 0.28 |
| Example 4 | rolled copper foil | (55 A/dm$^2$, 75 As/dm$^2$) + (10 A/dm$^2$, 22 As/dm$^2$) | — | (4) Co—Mo + (1) Zn—Cr | (4) 0.36, (1) 1.0 |
| Example 5 | rolled copper foil | (30 A/dm$^2$, 20 As/dm$^2$) | — | (6) Zn—Ni | 0.43 |
| Example 6 | rolled copper foil | (60 A/dm$^2$, 40 As/dm$^2$) | — | (1) Zn—Cr | 1.9 |
| Example 7 | ultra-thin copper foil with carrier | (50 A/dm$^2$, 65 As/dm$^2$) + (8 A/dm$^2$, 16 As/dm$^2$) | (60 A/dm$^2$, 40 As/dm$^2$) | (1) Zn—Cr | 1.9 |
| Example 8 | electrolytic copper foil | (55 A/dm$^2$, 75 As/dm$^2$) + (10 A/dm$^2$, 22 As/dm$^2$) | (35 A/dm$^2$, 33 As/dm$^2$) | (3) Zn | 0.31 |
| Example 9 | rolled copper foil | (60 A/dm$^2$, 38 As/dm$^2$) | — | (1) Zn—Cr | 1.9 |
| Example 10 | rolled copper foil | (30 A/dm$^2$, 20 As/dm$^2$) | — | (6) Zn—Ni, (7) Ni—W | (6) 0.43, (7) 0.21 |
| Example 11 | rolled copper foil | (55 A/dm$^2$, 75 As/dm$^2$) + (10 A/dm$^2$, 22 As/dm$^2$) | — | (4) Co—Mo + (1) Zn—Cr | (4) 1.08, (1) 1.0 |
| Example 12 | rolled copper foil | (55 A/dm$^2$, 75 As/dm$^2$) + (10 A/dm$^2$, 22 As/dm$^2$) | — | (4) Co—Mo + (1) Zn—Cr | (4) 1.08, (1) 1.0 |
| Example 13 | rolled copper foil | (50 A/dm$^2$, 60 As/dm$^2$) + (8 A/dm$^2$, 14 As/dm$^2$) | (30 A/dm$^2$, 17 As/dm$^2$) | (8) Ni—P + (1) Zn—Cr | (8) 0.10, (1) 2.6 |
| Example 14 | rolled copper foil | (50 A/dm$^2$, 65 As/dm$^2$) + (8 A/dm$^2$, 16 As/dm$^2$) | (40 A/dm$^2$, 40 As/dm$^2$) | (5) Co—Ni + (1) Zn—Cr | (5) 0.56, (1) 4.0 |
| Example 15 | rolled copper foil | (50 A/dm$^2$, 65 As/dm$^2$) + (8 A/dm$^2$, 16 As/dm$^2$) | (40 A/dm$^2$, 40 As/dm$^2$) | (5) Co—Ni + (1) Zn—Cr | (5) 0.52, (1) 4.0 |
| Example 16 | rolled copper foil | (50 A/dm$^2$, 60 As/dm$^2$) + (8 A/dm$^2$, 14 As/dm$^2$) | (30 A/dm$^2$, 17 As/dm$^2$) | (6) Zn—Ni + (1) Zn—Cr | (6) 0.10, (1) 2.6 |
| Comparative Example 1 | rolled copper foil | (50 A/dm$^2$, 65 As/dm$^2$) + (8 A/dm$^2$, 16 As/dm$^2$) | (30 A/dm$^2$, 18 As/dm$^2$) | (1) Zn—Cr | 0.5 |
| Comparative Example 2 | rolled copper foil | (50 A/dm$^2$, 65 As/dm$^2$) + (8 A/dm$^2$, 16 As/dm$^2$) | (40 A/dm$^2$, 40 As/dm$^2$) | (5) Co—Ni + (1) Zn—Cr | (5) 0.72, (1) 0.5 |
| Comparative Example 3 | electrolytic copper foil | (50 A/dm$^2$, 80 As/dm$^2$) + (8 A/dm$^2$, 25 As/dm$^2$) | (30 A/dm$^2$, 20 As/dm$^2$) | (2) Ni—Mo + (1) Zn—Cr | (2) 0.03, (1) 1.8 |
| Comparative Example 4 | rolled copper foil | — | — | (2) Ni—Mo + (3) Zn | (2) 0.10, (3) 0.47 |
| Comparative Example 5 | electrolytic copper foil | (50 A/dm$^2$, 85 As/dm$^2$) + (10 A/dm$^2$, 30 As/dm$^2$) | (30 A/dm$^2$, 12 As/dm$^2$) | (1) Zn—Cr | 0.5 |
| Comparative Example 6 | rolled copper foil | (30 A/dm$^2$, 20 As/dm$^2$) | — | (6) Zn—Ni | 0.07 |
| Comparative Example 7 | rolled copper foil | (60 A/dm$^2$, 70 As/dm$^2$) | — | (1) Zn—Cr | 2.1 |
| Comparative Example 8 | ultra-thin copper foil with carrier | (50 A/dm$^2$, 75 As/dm$^2$) + (8 A/dm$^2$, 30 As/dm$^2$) | (60 A/dm$^2$, 40 As/dm$^2$) | (1) Zn—Cr | 1.5 |

TABLE 2

| | surface roughness: Rz | deposition amount in surface treatment layer (μg/dm$^2$) | | | | | | laminated resin | initial peel strength | peel strength after 10 days under 180° C. | evaluation of peel strength | transmission loss at 20 GHz | evaluation of transmission loss |
|---|---|---|---|---|---|---|---|---|---|---|---|---|---|
| | μm | Co | Ni | Co + Ni | Zn | Mo | Zn + Mo | | | (kg/cm) | (kg/cm) | | (dB/10 cm) | |
| Example 1 | 0.9 | 700 | 300 | 1000 | 200 | 0 | 200 | LCP | 0.80 | 0.69 | ○ | 3.4 | ○ |
| Example 2 | 0.8 | 650 | 390 | 1040 | 100 | 160 | 260 | low dielectric PI | 0.75 | 0.61 | ○ | 3.4 | ○ |
| Example 3 | 1.2 | 1800 | 400 | 2200 | 150 | 0 | 150 | LCP | 0.92 | 0.45 | ○ | 4.0 | ○ |
| Example 4 | 1.2 | 200 | 0 | 200 | 100 | 250 | 350 | PTFE | 0.81 | 0.41 | ○ | 3.6 | ○ |
| Example 5 | 0.8 | 800 | 250 | 1050 | 180 | 0 | 180 | low dielectric PI | 0.71 | 0.60 | ○ | 3.4 | ○ |
| Example 6 | 0.9 | 0 | 780 | 780 | 190 | 0 | 190 | low dielectric PI | 0.66 | 0.55 | ○ | 3.3 | ○ |

TABLE 2-continued

| | surface roughness: Rz | deposition amount in surface treatment layer (μg/dm²) | | | | | | laminated resin | initial peel strength | peel strength after 10 days under 180° C. | evaluation of peel strength | transmission loss at 20 GHz | evaluation of transmission loss |
|---|---|---|---|---|---|---|---|---|---|---|---|---|---|
| | μm | Co | Ni | Co + Ni | Zn | Mo | Zn + Mo | | (kg/cm) | (kg/cm) | | (dB/10 cm) | |
| Example 7 | 1.1 | 0 | 750 | 750 | 190 | 0 | 190 | low dielectric PI | 0.82 | 0.71 | ○ | 3.5 | ○ |
| Example 8 | 1.2 | 1800 | 400 | 2200 | 165 | 0 | 165 | LCP | 0.92 | 0.53 | ○ | 4.0 | ○ |
| Example 9 | 0.9 | 0 | 750 | 750 | 190 | 0 | 190 | low dielectric PI | 0.66 | 0.55 | ○ | 3.2 | ○ |
| Example 10 | 0.8 | 800 | 350 | 1150 | 180 | 0 | 180 | low dielectric PI | 0.73 | 0.62 | ○ | 3.4 | ○ |
| Example 11 | 1.2 | 600 | 0 | 600 | 100 | 750 | 850 | PTFE | 0.82 | 0.63 | ○ | 3.6 | ○ |
| Example 12 | 1.2 | 284 | 0 | 284 | 100 | 355 | 455 | PTFE | 0.81 | 0.58 | ○ | 3.6 | ○ |
| Example 13 | 0.8 | 650 | 380 | 1030 | 260 | 0 | 260 | low dielectric PI | 0.75 | 0.63 | ○ | 3.4 | ○ |
| Example 14 | 0.9 | 2830 | 770 | 3600 | 400 | 0 | 400 | low dielectric PI | 0.92 | 0.86 | ○ | 4.0 | ○ |
| Example 15 | 0.9 | 2740 | 760 | 3500 | 400 | 0 | 400 | low dielectric PI | 0.92 | 0.85 | ○ | 3.7 | ○ |
| Example 16 | 0.8 | 650 | 340 | 990 | 300 | 0 | 300 | low dielectric PI | 0.77 | 0.71 | ○ | 3.4 | ○ |
| Comparative Example 1 | 0.9 | 700 | 300 | 1000 | 50 | 0 | 50 | LCP | 0.83 | 0.25 | x | 3.4 | ○ |
| Comparative Example 2 | 0.9 | 3200 | 800 | 4000 | 50 | 0 | 50 | low dielectric PI | 0.92 | 0.55 | ○ | 4.3 | x |
| Comparative Example 3 | 1.6 | 850 | 220 | 1070 | 180 | 30 | 210 | LCP | 1.05 | 0.98 | ○ | 4.2 | x |
| Comparative Example 4 | 0.7 | 0 | 110 | 110 | 250 | 100 | 350 | PTFE | 0.47 | 0.29 | x | 3.2 | ○ |
| Comparative Example 5 | 2.0 | 430 | 220 | 650 | 50 | 0 | 50 | LCP | 0.99 | 0.15 | x | 4.9 | x |
| Comparative Example 6 | 0.8 | 800 | 250 | 1050 | 30 | 0 | 30 | low dielectric PI | 0.71 | 0.27 | x | 3.3 | ○ |
| Comparative Example 7 | 1.1 | 0 | 1450 | 1450 | 210 | 0 | 210 | low dielectric PI | 0.81 | 0.70 | ○ | 4.1 | x |
| Comparative Example 8 | 1.6 | 0 | 780 | 780 | 150 | 0 | 150 | low dielectric PI | 0.97 | 0.69 | ○ | 4.3 | x |

TABLE 3

| | primary particle plating solution (I) | primary particle plating solution (II) | secondary particle plating solution |
|---|---|---|---|
| Example 1 | Cu: 10 g/l, H2SO4: 60 g/l, 35° C. | Cu: 23 g/l, H2SO4: 80 g/l, 40° C. | Cu: 15 g/l, Co: 10 g/l, Ni: 10 g/l, 35° C., pH 3.0 |
| Example 2 | Cu: 10 g/l, H2SO4: 60 g/l, 35° C. | Cu: 23 g/l, H2SO4: 80 g/l, 40° C. | Cu: 15 g/l, Co: 10 g/l, Ni: 10 g/l, 35° C., pH 3.0 |
| Example 3 | Cu: 10 g/l, H2SO4: 60 g/l, 35° C. | Cu: 23 g/l, H2SO4: 80 g/l, 40° C. | Cu: 15 g/l, Co: 10 g/l, Ni: 10 g/l, 35° C., pH 3.0 |
| Example 4 | Cu: 10 g/l, H2SO4: 60 g/l, 35° C. | Cu: 23 g/l, H2SO4: 80 g/l, 40° C. | — |
| Example 5 | Cu: 15 g/l, Co: 20 g/l, Ni: 10 g/l, 35° C., pH 3.0 | — | — |
| Example 6 | Cu: 10 g/l, Ni: 7 g/l, 35° C., pH 2.8 | — | — |
| Example 7 | Cu: 10 g/l, H2SO4: 60 g/l, 35° C. | Cu: 23 g/l, H2SO4: 80 g/l, 40° C. | Cu: 10 g/l, Ni: 7 g/l, 35° C., pH 2.8 |
| Example 8 | Cu: 10 g/l, H2SO4: 60 g/l, 35° C. | Cu: 23 g/l, H2SO4: 80 g/l, 40° C. | Cu: 15 g/l, Co: 10 g/l, Ni: 10 g/l, 35° C., pH 3.0 |
| Example 9 | Cu: 10 g/l, Ni: 7 g/l, 35° C., pH 2.8 | — | — |
| Example 10 | Cu: 15 g/l, Co: 20 g/l, Ni: 10 g/l, 35° C., pH 3.0 | — | — |
| Example 11 | Cu: 10 g/l, H2SO4: 60 g/l, 35° C. | Cu: 23 g/l, H2SO4: 80 g/l, 40° C. | — |
| Example 12 | Cu: 10 g/l, H2SO4: 60 g/l, 35° C. | Cu: 23 g/l, H2SO4: 80 g/l, 40° C. | — |
| Example 13 | Cu: 10 g/l, H2SO4: 60 g/l, 35° C. | Cu: 23 g/l, H2SO4: 80 g/l, 40° C. | Cu: 15 g/l, Co: 10 g/l, Ni: 10 g/l, 35° C., pH 3.0 |
| Example 14 | Cu: 10 g/l, H2SO4: 60 g/l, 35° C. | Cu: 23 g/l, H2SO4: 80 g/l, 40° C. | Cu: 15 g/l, Co: 10 g/l, Ni: 10 g/l, 35° C., pH 3.0 |
| Example 15 | Cu: 10 g/l, H2SO4: 60 g/l, 35° C. | Cu: 23 g/l, H2SO4: 80 g/l, 40° C. | Cu: 15 g/l, Co: 10 g/l, Ni: 10 g/l, 35° C., pH 3.0 |
| Example 16 | Cu: 10 g/l, H2SO4: 60 g/l, 35° C. | Cu: 23 g/l, H2SO4: 80 g/l, 40° C. | Cu: 15 g/l, Co: 10 g/l, Ni: 10 g/l, 35° C., pH 3.0 |
| Comparative Example 1 | Cu: 10 g/l, H2SO4: 60 g/l, 35° C. | Cu: 23 g/l, H2SO4: 80 g/l, 40° C. | Cu: 15 g/l, Co: 10 g/l, Ni: 10 g/l, 35° C., pH 3.0 |
| Comparative Example 2 | Cu: 10 g/l, H2SO4: 60 g/l, 35° C. | Cu: 23 g/l, H2SO4: 80 g/l, 40° C. | Cu: 15 g/l, Co: 10 g/l, Ni: 10 g/l, 35° C., pH 3.0 |

TABLE 3-continued

|  | primary particle plating solution (I) | primary particle plating solution (II) | secondary particle plating solution |
|---|---|---|---|
| Comparative Example 3 | Cu: 10 g/l, H2SO4: 60 g/l, 35° C. | Cu: 23 g/l, H2SO4: 80 g/l, 40° C. | Cu: 15 g/l, Co: 23 g/l, Ni: 10 g/l, 35° C., pH 3.0 |
| Comparative Example 4 | — | — | — |
| Comparative Example 5 | Cu: 10 g/l, H2SO4: 60 g/l, 35° C. | Cu: 23 g/l, H2SO4: 80 g/l, 40° C. | Cu: 15 g/l, Co: 10 g/l, Ni: 10 g/l, 35° C., pH 3.0 |
| Comparative Example 6 | Cu: 15 g/l, Co: 15 g/l, Ni: 10 g/l, 35° C., pH 3.0 | — | — |
| Comparative Example 7 | Cu: 10 g/l, Ni: 7 g/l, 35° C., pH 2.8 | — | — |
| Comparative Example 8 | Cu: 10 g/l, H2SO4: 60 g/l, 35° C. | Cu: 23 g/l, H2SO4: 80 g/l, 40° C. | Cu: 10 g/l, Ni: 7 g/l, 35° C., pH 2.8 |

TABLE 4

| cover plating solution | composition | liquid temperature (° C.) | pH | current density (A/dm) | electrification time (second) |
|---|---|---|---|---|---|
| (1)Zn—Cr | potassium dichromate 1~10 g/L<br>Zn 0.1~5 g/L | 40~60 | 0.5~10 | 0.01~2.6 | 0.05~30 |
| (2)Ni—Mo | Nickel sulfate 270 to 280 g/L<br>Nickel chloride 35 to 45 g/L<br>Nickel acetate 10 to 20 g/L<br>Sodium molybdate 1 to 60 g/L<br>Trisodium citrate 10 to 50 g/L<br>Sodium dodecyl sulfate 50 to 90 ppm | 20~65 | 4~12 | 0.5~5 | 0.1~5 |
| (3)Zn | Zn 1~15 g/L | 25~50 | 2~6 | 0.5~5 | 0.01~3 |
| (4)Co—Mo | Co 1~20 g/L<br>Sodium molybdate 1 to 60 g/L<br>Sodium citrate 10 to 110 g/L | 25~50 | 5~7 | 1~4 | 0.1~5 |
| (5)Co—Ni | Co 1~20 g/L<br>Ni 1~20 g/L | 30~80 | 1.5~3.5 | 1~20 | 0.1~4 |
| (6)Zn—Ni | Zn 1~30 g/L<br>Ni 1~30 g/L | 40~50 | 2~5 | 0.5~5 | 0.01~3 |
| (7)Ni—W | Ni 1~30 g/L<br>W 1~300 mg/L | 30~50 | 2~5 | 0.1~5 | 0.01~3 |
| (8)Ni—P | Ni 1~30 g/L<br>P 1~10 g/L | 30~50 | 2~5 | 0.1~5 | 0.01~3 |

(Evaluation Results)

In each of Examples 1 to 16, the transmission loss was favorably suppressed, and the peel strength was also good.

In Comparative Examples 1 and 6, the deposition amount of Zn in the surface treatment layer was less than 150 µg/dm², and the sum of the deposition amount of Zn and Mo in the surface treatment layer was less than 200 µg/dm², and the peel strength was poor.

In Comparative Example 2, since the deposition amount of Co in the surface treatment layer was more than 3000 µg/dm², the transmission loss was poor.

In Comparative Examples 3 and 8, the ten point average roughness Rz of the outermost surface of the surface treatment layer was more than 1.5 µm, so the transmission loss was poor.

In Comparative Example 4, a primary particle layer and a secondary particle layer were not formed, and the peel strength was poor.

In Comparative Example 5, the deposition amount of Zn in the surface treatment layer was less than 150 µg/dm², and the sum of the deposition amount of Zn and Mo was less than 200 µg/dm², and the ten point average roughness Rz of the outermost surface of the surface treatment layer was more than 1.5 µm, and thus the transmission loss and the peel strength were poor.

In Comparative Example 7, Ni was contained in the surface treatment layer, but since the deposition amount of Ni exceeded 800 µg/dm², the transmission loss was poor.

This application claims priority from Japanese Patent Application No. 2016-236250, filed on Dec. 5, 2016 and Japanese Patent Application No. 2017-205410, filed on Oct. 24, 2017, the entire disclosure of which is incorporated herein by reference.

The invention claimed is:

1. A surface treated copper foil, comprising
a copper foil, and
a surface treatment layer on at least one surface of the copper foil,
wherein the surface treatment layer has a primary particle layer and a secondary particle layer,
a deposition amount of Zn in the surface treat layer is 150 µg/dm² or more,
the surface treatment layer does not contain Ni, or a deposition amount of Ni in the surface treatment layer is 800 µg/dm² or less,
the surface treatment layer does not contain Co, or a deposition amount of Co in the surface treatment layer is 3000 µg/dm² or less, and
a ten point average roughness Rz of an outermost surface of the surface treatment layer is 1.3 µm or less.

2. A surface treated copper foil, comprising
a copper foil, and
a surface treatment layer on at least one surface of the copper foil,
wherein the surface treatment layer has a primary particle layer and a secondary particle layer,
the surface treatment layer contains Zn and Mo,
a sum of deposition amount of Zn and Mo in the surface treatment layer is 200 μg/dm$^2$ or more,
the surface treatment layer does not contain Ni, or a deposition amount of Ni in the surface treatment layer is 800 μg/dm$^2$ or less,
the surface treatment layer does not contain Co, or a deposition amount of Co in the surface treatment layer is 3000 μg/dm$^2$ or less, and
a ten point average roughness Rz of an outermost surface of the surface treatment layer is 1.3 μm or less.

3. The surface treated copper foil according to claim 1, wherein the deposition amount of Zn in the surface treatment layer is 200 μg/dm$^2$ or more.

4. The surface treated copper foil according to claim 1, wherein the deposition amount of Zn in the surface treatment layer is 250 μg/dm$^2$ or more.

5. The surface treated copper foil according to claim 1, wherein the deposition amount of Ni in the surface treatment layer is 750 μg/dm$^2$ or less.

6. The surface treated copper foil according to claim 2, wherein the deposition amount of Ni in the surface treatment layer is 750 μg/dm$^2$ or less.

7. The surface treated copper foil according to claim 1, wherein the deposition amount of Co in the surface treatment layer is 2790 μg/dm$^2$ or less.

8. The surface treated copper foil according to claim 2, wherein the deposition amount of Co in the surface treatment layer is 2790 μg/dm$^2$ or less.

9. The surface treated copper foil according to claim 1, wherein the ten point average roughness Rz of the outermost surface of the surface treatment layer is 1.0 μm or less.

10. The surface treated copper foil according to claim 2, wherein the sum of deposition amount of Zn and Mo in the surface treatment layer is 340 μg/dm$^2$ or more.

11. The surface treated copper foil according to claim 1, wherein the surface treatment layer contains Co and Ni, and a sum of deposition amount of Co and Ni in the surface treatment layer is 3500 μg/dm$^2$ or less.

12. The surface treated copper foil according to claim 1, wherein after laminating the surface treated copper foil, from the side of the surface treatment layer, with a resin, etching the surface treated copper foil and forming a copper wiring having a width of 10 mm, a peel strength at the time of peeling off the copper wiring from the resin in a 90° direction is 0.5 kg/cm or more, and
the resin and conditions for the lamination are any one, two, or three of the following (1) to (3):
(1) The resin: liquid crystal polymer resin that is a copolymer of hydroxybenzoic acid and hydroxynaphthoic acid, thickness of 50 μm, and
The conditions for the lamination: pressure 3.5 MPa, heating temperature 300° C., heating time 10 minutes;
(2) The resin: low dielectric polyimide resin, thickness 50 μm, and
The conditions for the lamination: pressure 4 MPa, heating temperature 360° C., heating time 5 minutes;
(3) The resin: polytetrafluoroethylene, thickness 50 μm, and
The conditions for the lamination: pressure 5 MPa, heating temperature 350° C., heating time 30 minutes.

13. The surface treated copper foil according to claim 12 wherein the peel strength is 0.7 kg/cm or more.

14. The surface treated copper foil according to claim 1, wherein after laminating the surface treated copper foil, from the side of the surface treatment layer, with a resin, etching the surface treated copper foil, forming a copper wiring having a width of 10 mm, and heating the copper wiring under the atmosphere at 180° C. for 10 days, a peel strength at the time of peeling off the copper wiring from the resin in a 90° direction is 0.4 kg/cm or more, and
the resin and conditions for the lamination are any one, two, or three of the following (1) to (3):
(1) The resin: liquid crystal polymer resin that is a copolymer of hydroxybenzoic acid and hydroxynaphthoic acid, thickness of 50 μm, and
The conditions for the lamination: pressure 3.5 MPa, heating temperature 300° C., heating time 10 minutes;
(2) The resin: low dielectric polyimide resin, thickness 50 μm, and
The conditions for the lamination: pressure 4 MPa, heating temperature 360° C., heating time 5 minutes;
(3) The resin: polytetrafluoroethylene, thickness 50 μm, and
The conditions for the lamination: pressure 5 MPa, heating temperature 350° C., heating time 30 minutes.

15. The surface treated copper foil according to claim 14, wherein after laminating the surface treated copper foil, from the side of the surface treatment layer, with the resin, etching the surface treated copper foil, forming the copper wiring having the width of 10 mm, and heating the copper wiring under the atmosphere at 180° C. for 10 days, the peel strength at the time of peeling off the copper wiring from the resin in the 90° direction is 0.5 kg/cm or more.

16. The surface treated copper foil according to claim 1, satisfying any one of the following (16-1) to (16-4):
(16-1) The surface treatment layer has either one or both of the following (A) and (B) on or over the primary particle layer or on or over the secondary particle layer:
(A) An alloy layer comprising Ni, and one or more elements selected from the group consisting of Fe, Cr, Mo, Zn, Ta, Cu, Al, P, W, Mn, Sn, As and Ti
(B) A chromate treatment layer;
(16-2) The surface treatment layer has at least one of the following (A) and (B) on or over the primary particle layer or on or over the secondary particle layer, and the surface treatment layer has the following (C) on or over the primary particle layer or on or over the secondary particle layer:
(A) An alloy layer comprising Ni, and one or more elements selected from the group consisting of Fe, Cr, Mo, Zn, Ta, Cu, Al, P, W, Mn, Sn, As and Ti
(B) A chromate treatment layer
(C) a silane coupling treatment layer;
(16-3) The surface treatment layer has at least one of a Ni—Zn alloy layer and a chromate treatment layer, on or over the primary particle layer or on or over the secondary particle layer;
(16-4) The surface treatment layer has at least one of a Ni—Zn alloy layer and a chromate treatment layer on or over the primary particle layer or on or over the secondary particle layer, and the surface treatment layer has a silane coupling treatment layer, on or over the primary particle layer or on or over the secondary particle layer.

17. A high frequency circuit substrate comprising the surface treated copper foil according to claim 1.

18. A surface treated copper foil with a resin layer, wherein the surface treated copper foil is the surface treated copper foil according to claim 1.

19. A copper foil with a carrier,
wherein the carrier has an intermediate layer and an ultra-thin copper layer on at least one surface of the carrier, and
the ultra-thin copper layer is the surface treated copper foil according to claim 1, or the ultra-thin copper layer is a surface treated copper foil with resin layer, wherein the surface treated copper foil is the surface treated copper foil according to claim 1.

20. A laminate, comprising the surface treated copper foil according to claim 1.

21. A laminate, comprising the surface treated copper foil according to claim 2.

22. A laminate, comprising the copper foil with carrier according to claim 19.

23. The surface treated copper foil according to claim 1, wherein the surface treatment layer comprises:
the primary particle layer as a layer comprising (i) primary roughening particles formed directly on the copper foil and (ii) primary roughening particles stacked on the primary roughening particles formed directly on the copper foil;
the secondary particle layer as a layer comprising secondary roughening particles, which are formed on or above the primary roughening particles of the primary particle layer, wherein the secondary roughening particles (i) have a composition different from that of the primary roughening particles, or (ii) comprise an element not contained in the primary roughening particles; and
a cover plating on or over the secondary particle layer, the cover plating comprising the Zn.

24. The surface treated copper foil according to claim 2, wherein the surface treatment layer comprises:
the primary particle layer as a layer comprising (i) primary roughening particles formed directly on the copper foil and (ii) primary roughening particles stacked on the primary roughening particles formed directly on the copper foil;
the secondary particle layer as a layer comprising secondary roughening particles, which are formed on or above the primary roughening particles of the primary particle layer, wherein the secondary roughening particles (i) have a composition different from that of the primary roughening particles, or (ii) comprise an element not contained in the primary roughening particles; and
a cover plating on or over the secondary particle layer, the cover plating comprising the Zn and the Mo.

* * * * *